(12) United States Patent
Seeger et al.

(10) Patent No.: US 8,947,081 B2
(45) Date of Patent: *Feb. 3, 2015

(54) MICROMACHINED RESONANT MAGNETIC FIELD SENSORS

(75) Inventors: Joseph Seeger, Menlo Park, CA (US); Chiung C. Lo, Campbell, CA (US); Baris Cagdaser, Sunnyvale, CA (US); Derek Shaeffer, Redwood City, CA (US)

(73) Assignee: Invensense, Inc., San Jose, CA (US)

( * ) Notice: Subject to any disclaimer, the term of this patent is extended or adjusted under 35 U.S.C. 154(b) by 531 days.

This patent is subject to a terminal disclaimer.

(21) Appl. No.: 13/004,383

(22) Filed: Jan. 11, 2011

(65) Prior Publication Data

US 2012/0176129 A1 Jul. 12, 2012

(51) Int. Cl.
*G01R 33/02* (2006.01)
*G01R 33/038* (2006.01)
*G01R 33/028* (2006.01)

(52) U.S. Cl.
CPC .......... *G01R 33/038* (2013.01); *G01R 33/0286* (2013.01)
USPC ....................................... 324/252

(58) Field of Classification Search
CPC ................. G01R 33/0286; B81B 2201/02
USPC ........................ 324/252, 202, 130
See application file for complete search history.

(56) References Cited

U.S. PATENT DOCUMENTS

| | | |
|---|---|---|
| 3,728,090 A | 4/1973 | Hoffman et al. |
| 5,083,466 A | 1/1992 | Holm-Kennedy et al. |
| 5,142,921 A | 9/1992 | Stewart et al. |
| 5,249,732 A | 10/1993 | Thomas |
| 5,359,893 A | 11/1994 | Dunn |
| 5,367,194 A | 11/1994 | Beatty |
| 5,426,070 A | 6/1995 | Shaw et al. |
| 5,485,032 A | 1/1996 | Schepis et al. |
| 5,656,778 A | 8/1997 | Roszhart |
| 5,659,195 A | 8/1997 | Kaiser et al. |
| 5,693,574 A | 12/1997 | Schuster et al. |

(Continued)

FOREIGN PATENT DOCUMENTS

| | | |
|---|---|---|
| WO | WO 02/42716 | 5/2002 |
| WO | WO 03/038449 | 5/2003 |

OTHER PUBLICATIONS

Bao Vu, et al., "Patterned eutectic bonding with Al/Ge thin films for microelectromechanical systems," May 31, 1996, pp. 2588-2594.

(Continued)

*Primary Examiner* — Patrick Assouad
*Assistant Examiner* — Demetrius Pretlow
(74) *Attorney, Agent, or Firm* — Sawyer Law Group, P.C.

(57) ABSTRACT

A micromachined magnetic field sensor is disclosed. The micromachined magnetic field sensor includes a substrate; and a drive subsystem partially supported by the substrate with a plurality of beams, and at least one anchor; a mechanism for providing an electrical current through the drive subsystem along a first axis; and Lorentz force acting on the drive subsystem along a second axis in response to a magnetic field vector along a third axis. The micromachined magnetic field sensor also includes a position transducer to detect the motion of the drive subsystem and an electrostatic offset cancellation mechanism coupled to the drive subsystem.

13 Claims, 16 Drawing Sheets

(56) References Cited

U.S. PATENT DOCUMENTS

| | | |
|---|---|---|
| 5,703,293 A | 12/1997 | Zabler et al. |
| 5,780,740 A | 7/1998 | Lee et al. |
| 5,895,850 A | 4/1999 | Buestgens |
| 5,915,168 A | 6/1999 | Salatino et al. |
| 5,959,452 A | 9/1999 | Givens et al. |
| 5,992,233 A | 11/1999 | Clark |
| 5,996,409 A | 12/1999 | Funk et al. |
| 6,036,872 A | 3/2000 | Wood et al. |
| 6,122,961 A | 9/2000 | Geen et al. |
| 6,128,961 A | 10/2000 | Haronian |
| 6,153,917 A | 11/2000 | Matsunaga et al. |
| 6,189,381 B1 | 2/2001 | Huang et al. |
| 6,199,748 B1 | 3/2001 | Zhu et al. |
| 6,229,190 B1 | 5/2001 | Bryzek et al. |
| 6,250,157 B1 | 6/2001 | Touge |
| 6,275,034 B1 | 8/2001 | Tran et al. |
| 6,391,673 B1 | 5/2002 | Ha et al. |
| 6,426,687 B1 | 7/2002 | Osborn |
| 6,430,998 B2 | 8/2002 | Kawai et al. |
| 6,433,411 B1 | 8/2002 | Degani et al. |
| 6,448,109 B1 | 9/2002 | Karpman |
| 6,452,238 B1 | 9/2002 | Orcutt et al. |
| 6,479,320 B1 | 11/2002 | Gooch |
| 6,480,320 B2 | 11/2002 | Nasiri |
| 6,481,283 B1 | 11/2002 | Cardarelli |
| 6,481,284 B2 | 11/2002 | Geen et al. |
| 6,481,285 B1 | 11/2002 | Shkel et al. |
| 6,487,908 B2 | 12/2002 | Geen et al. |
| 6,496,348 B2 | 12/2002 | McIntosh |
| 6,508,122 B1 | 1/2003 | McCall et al. |
| 6,513,380 B2 | 2/2003 | Reeds, III et al. |
| 6,519,075 B2 | 2/2003 | Carr et al. |
| 6,528,344 B2 | 3/2003 | Kang |
| 6,528,887 B2 | 3/2003 | Daneman et al. |
| 6,533,947 B2 | 3/2003 | Nasiri et al. |
| 6,555,417 B2 | 4/2003 | Spooner et al. |
| 6,559,530 B2 | 5/2003 | Goldsmith et al. |
| 6,583,374 B2 * | 6/2003 | Knieser et al. ............... 200/181 |
| 6,617,750 B2 * | 9/2003 | Dummermuth et al. ...... 310/309 |
| 6,621,137 B1 | 9/2003 | Ma et al. |
| 6,635,509 B1 | 10/2003 | Ouellet |
| 6,650,455 B2 | 11/2003 | Miles |
| 6,660,564 B2 | 12/2003 | Brady |
| 6,686,639 B1 | 2/2004 | Tsai |
| 6,770,569 B2 | 8/2004 | Foerstner et al. |
| 6,794,272 B2 | 9/2004 | Turner et al. |
| 6,796,178 B2 | 9/2004 | Jeong et al. |
| 6,808,955 B2 | 10/2004 | Ma |
| 6,852,926 B2 | 2/2005 | Ma et al. |
| 6,892,575 B2 | 5/2005 | Nasiri et al. |
| 6,918,297 B2 | 7/2005 | MacGugan |
| 6,936,491 B2 | 8/2005 | Partridge et al. |
| 6,936,494 B2 | 8/2005 | Cheung |
| 6,939,473 B2 | 9/2005 | Nasiri et al. |
| 7,004,025 B2 | 2/2006 | Tamura |
| 7,028,547 B2 | 4/2006 | Shiratori et al. |
| 7,104,129 B2 | 9/2006 | Nasiri et al. |
| 7,196,404 B2 | 3/2007 | Schirmer et al. |
| 7,433,267 B2 | 10/2008 | Murphy et al. |
| 8,542,010 B2 | 9/2013 | Cesaretti et al. |
| 2002/0051258 A1 | 5/2002 | Tamura |
| 2003/0020472 A1 * | 1/2003 | Kretschmann et al. ....... 324/259 |
| 2003/0074967 A1 | 4/2003 | Tang et al. |
| 2003/0110858 A1 | 6/2003 | Kim et al. |
| 2003/0164041 A1 | 9/2003 | Jeong et al. |
| 2004/0027029 A1 * | 2/2004 | Borwick, III et al. ........ 310/309 |
| 2004/0055380 A1 | 3/2004 | Shcheglov et al. |
| 2004/0158439 A1 * | 8/2004 | Kim et al. .................... 702/190 |
| 2005/0081633 A1 | 4/2005 | Nasiri et al. |
| 2005/0170656 A1 | 8/2005 | Nasiri et al. |
| 2005/0241394 A1 * | 11/2005 | Clark ........................ 73/504.12 |
| 2005/0248340 A1 * | 11/2005 | Berkcan et al. ............... 324/259 |
| 2005/0252293 A1 * | 11/2005 | Won et al. ................... 73/514.32 |
| 2006/0247847 A1 * | 11/2006 | Carter et al. ................... 701/200 |
| 2007/0030001 A1 | 2/2007 | Brunson et al. |
| 2007/0039147 A1 | 2/2007 | Shimanouchi et al. |
| 2007/0096729 A1 * | 5/2007 | Brunson et al. ............... 324/244 |
| 2007/0181963 A1 * | 8/2007 | Berkcan et al. ............... 257/415 |
| 2008/0079444 A1 | 4/2008 | Denison |
| 2008/0122431 A1 | 5/2008 | Berkcan et al. |
| 2009/0193892 A1 | 8/2009 | Seeger |
| 2011/0140693 A1 * | 6/2011 | Baldo et al. .................... 324/244 |

OTHER PUBLICATIONS

Sumant Sood, et al., "Al-Ge Eutectic Wafer Bonding and Bond Characterization for CMOS Compatible Wafer Packaging", SVTC Technologies, May 8, 2010, pp. 1-8.

Supplementary European Search Report dated Jul. 20, 2010, application No. 06737697.0-1528/ 1859475, PCT/US2006008543 (3404EP).

Amendment filed Feb. 14, 2011, in European Patent Application No. 06737697.0-1528 (3404EP).

F. D. Bannon III, et al., "High frequency microelectromechanical IF filters," Technical Digest, IEEE International Election Devices Meeting, San Francisco, California, Dec. 8-11, 1996, pp. 773-776, [retrieved on May 23, 2012], [retrieved from URL: http://ieeexplore.ieee.org/stamp/stamp.jsp?tp=&arnumber=554094&isnumber=12029].

Notification of Transmittal of the International Search Report and the Written Opinion of the International Searching Authority or the Declaration, issued in International Application No. PCT/US06/44919 (3401C-CIP-PCT), Feb. 7, 2008.

May et al., Resonant Magnetic Field Sensors Based on MEMS Technology, 2009.

Xie, Gyroscope and Micromirror Design Using Vertical-Axis CMOS-MEMS Actuation and Sensing, 2002.

* cited by examiner

MICROMACHINED RESONANT MAGNETIC FIELD SENSORS

FIELD OF THE INVENTION

The present invention relates generally to sensors and more particularly to micromachined resonant magnetic field sensors.

RELATED APPLICATIONS

U.S. Pat. No. 6,892,575, entitled "X-Y Axis Dual-Mass Tuning Fork Gyroscope with Vertically Integrated Electronics and Wafer-Scale Hermetic Packaging," issued May 17, 2005, U.S. Pat. No. 6,939,473, entitled "Method of Making an X-Y Axis Dual-Mass Tuning Fork Gyroscope with Vertically Integrated Electronics and Wafer-Scale Hermetic Packaging," issued Sep. 6, 2005, U.S. Pat. No. 7,104,129, entitled "Vertically Integrated MEMS Structure," issued Sep. 12, 2006, U.S. Pat. No. 7,247,246, entitled "Vertical Integration of a MEMS Structure with Electronics in a Hermetically Sealed Cavity," issued Jul. 24, 2007, U.S. Pat. No. 7,442,570, entitled "Method of Fabrication of Al/GE Bonding in a Wafer Packaging Environment and a Product Produced Therefrom," issued Oct. 28, 2008, U.S. patent application Ser. No. 12/184,231, entitled "Method of Fabrication of Al/GE Bonding in a Wafer Packaging Environment and a Product Produced Thereupon," filed on Jul. 31, 2008 and assigned to the assignee of the present invention, U.S. patent application, Serial No. 2009019382, entitled "Dual Mode Sensing For Vibratory Gyroscope, filed on Aug. 6, 2009 and assigned to the assignee of the present invention; and U.S. Patent Application, entitled "Micromachined Resonant Magnetic Field Sensors," serial no. (IVS-144, 4976P), filed on even date herewith, and assigned to the assignee of the present invention, all of which are incorporated herein by reference in their entireties.

BACKGROUND OF THE INVENTION

Magnetic field sensors are widely deployed in consumer and industrial instruments for applications varying from position sensing, current sensing, data storage, and magnetic compassing. There are many methods to sense magnetic fields including Hall-effect, magneto-diode, magneto-transistor, magnetoresistive-effect, magnetic tunnel junction, magneto-optical, fluxgate, search coil, and Lorentz force.

The Lorentz force resonant sensor fabricated by means of MEMS technology is preferred due to its low-cost batch fabrication technology. Lorentz force-effect resonant sensors are manufactured in a process flow similar to the process of motion sensors, such as accelerometers and gyroscopes. In addition, because Lorentz force-effect does not require special magnetic materials, it is the most compatible sensing mechanism for an integrated platform of motion sensors; magnetic field sensors, accelerometers, and gyroscopes. However, to detect a magnetic field as weak as the earth magnetic field, the magnetic field sensor is desired to have high sensitivity and low offset. High sensitivity is generally achieved by exciting at the resonant frequency and being packaged in vacuum for high quality factor. However, if the drive frequency is off by Δf from the resonant frequency, the sensitivity decreases significantly which proportional to Δf. In prior art, a close-loop frequency control system is needed to adjust the driving frequency dynamically to prevent significant sensitivity variation and the complicated close-loop control system could consume as high as 1 milliwatt per axis. In addition, the offset is generally larger than the signal and the offset variation limits the minimum detectable signal level. Thus, the design to mitigate offset is critical. Accordingly, what is needed is a system and method to address the above-identified issues. The present invention addresses such a need.

BRIEF SUMMARY OF THE INVENTION

A micromachined magnetic field sensor is disclosed. The micromachined magnetic field sensor comprises a substrate; and a drive subsystem partially supported by the substrate with a plurality of beams, and at least one anchor; a mechanism for providing an electrical current through the drive subsystem along a first axis; and Lorentz force acting on the drive subsystem along a second axis in response to a magnetic field vector along a third axis. The micromachined magnetic field sensor also includes a position transducer to detect the motion of the drive subsystem and an electrostatic offset cancellation mechanism coupled to the drive subsystem.

In designing high sensitivity, high manufacturability, low cost, and low power consumption Lorentz force magnetic field sensors, the present invention addresses the need of:

1. High-manufacturability, low power consumption, and low Brownian noise by establishing a open-loop dual-mode resonating devices;

2. High sensitivity and low cost fabrication by deploying electrostatic coupling spring with high bias voltage at the sensing subsystem;

3. Low offset by deploying:

a) electrical shield structures comprising at least one electrical source connected to at least one electrode to reduce the electrostatic offset force along the second axis generated by parasitic capacitors around the drive subsystem;

b) the shield structure has a force-balanced characteristic with two shield structures sandwiching the drive subsystem along the second axis to cancel the electrostatic offset force generated by the shield structures;

c) the voltage of the electrical source of the shield structures is equal to the voltage of the drive point of the drive subsystem to minimize the electrostatic offset force.

d) a mismatch-trimming actuator moving the micromachined magnetic sensor along the second axis in order to reduce the gap mismatch of the force-balanced electrostatic coupling springs;

e) an AC ripple voltage detector where the detection connects a drive point to at least one anchor for detecting the ripple of the drive point.

4. Low power consumption by having electrostatic self-test actuator.

By harnessing these design strategies, a Lorentz force resonant sensor can be implemented in a way to allow for on-chip integration of magnetic field sensors with other motional sensors.

DETAILED DESCRIPTION OF THE INVENTION

The present invention relates generally to sensors and more particularly to micromachined resonant magnetic field sensors. The following description is presented to enable one of ordinary skill in the art to make and use the invention is provided in the context of a patent application and its requirements. The present invention is not intended to be limited to the implementations shown but is to be accorded the widest scope consistent with the principles and features described herein.

Figure 1:
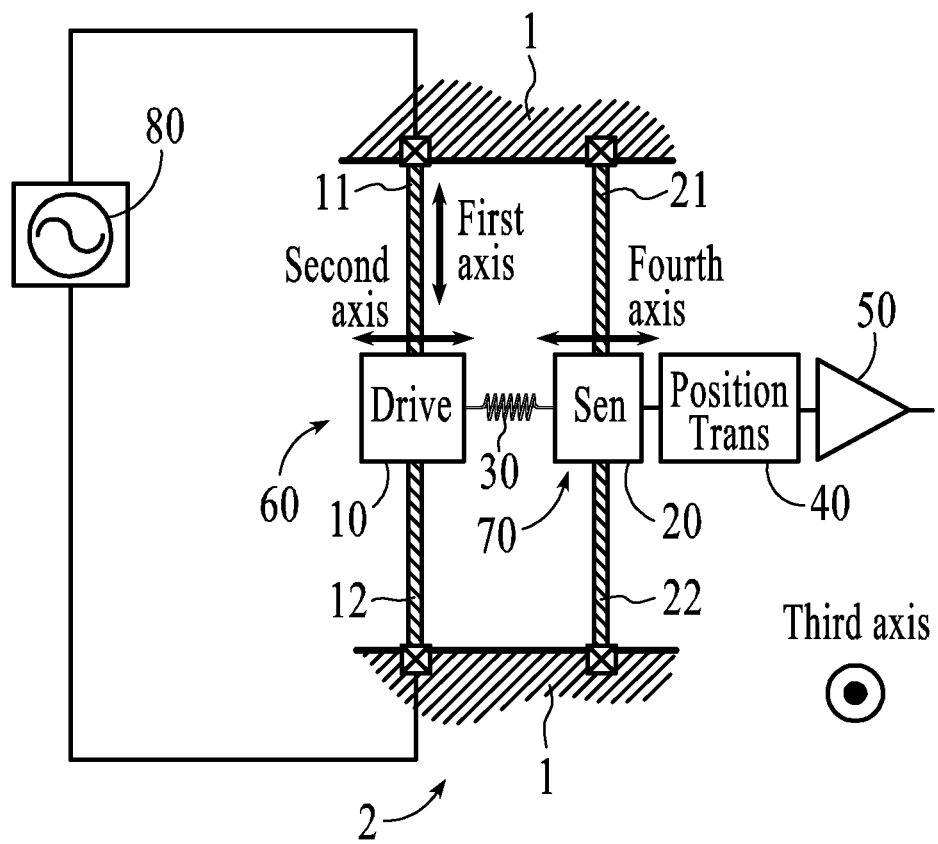
FIG. 1 is an embodiment of a dual mode open-loop magnetometer system.

An embodiment of an open-loop Lorentz-force magnetic sensing device is shown in FIG. 1.

System

The dual mode open-loop system 2 comprises a drive subsystem 60, a sense subsystem 70 and a coupling spring 30, a position transducer 40, signal processing electronics 50, and drive electronics 80 for supplying a current flowing through a portion of the drive subsystem 60. The drive subsystem 60 comprises a plurality of beams, such that in the presence of a magnetic field, the drive subsystem 60 is actuated through the Lorentz force proportional to the magnetic field. The coupling spring 30 couples the motion and the force of the drive subsystem 60 and the sense subsystem 70 resulting in at least two resonant modes: in-phase mode and anti-phase mode. The sense subsystem 70 comprising a plurality of beams and converts the actuation force from the coupling spring 30 into output motion. The position transducer 40 detects the output motion of the sense subsystem 70 and may be designed with mechanisms comprising parallel plate capacitive transducers, interdigitated comb capacitive transducers, piezoresistive sensors, optical sensors, and piezoelectric sensors. The drive subsystem 60 and the sense subsystem 70 are mechanically anchored to a substrate 1 through plurality of beams, respectively.

Operation

FIG. 1 depicts the disclosed sensing method comprising flexibly-coupled drive and sense subsystems 60 and 70. An AC current generated by the drive electronics 80 passes through a plurality of beams 11 and 12 and establishes a current vector in the first axis at the drive point 10. A distributed Lorentz force is generated in the second axis in the presence of a magnetic field vector in the third axis, and the total force is $$F_{Lorentz} = \int (I \times B) dl \tag{1}$$

where the I is the magnitude of AC current, B is the magnitude of magnetic field density, and dl is the unit length of the portion of the plurality of beams 11, 12 where AC current flows. The Lorentz force actuates the drive point 10 along the second axis proportional to the magnetic field density.

A coupling spring 30 couples the motion of the drive point 10 to the sense point 20 and the sense subsystem 70 resulting in motion at the sense subsystem 70 along the fourth axis proportional to the magnetic field density. The motion at the sense subsystem 70 is detected by a position transducer 40 and the electrical signals from the position transducer 40 are further processed by the signal processing unit 50.

Figure 2A:
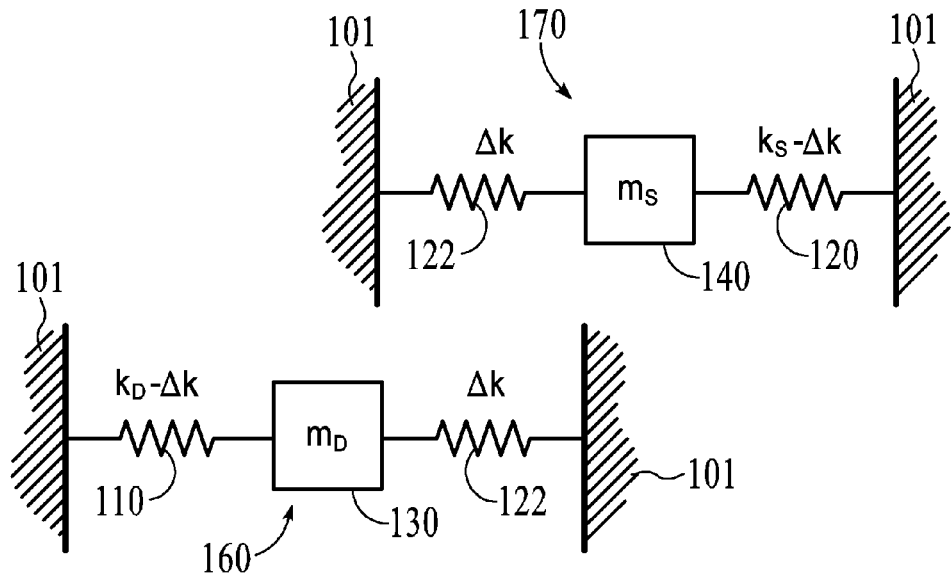
FIGS. 2A and 2B are a model of a dual mass system (a) before coupled and (b) after coupled.
Figure 2B:
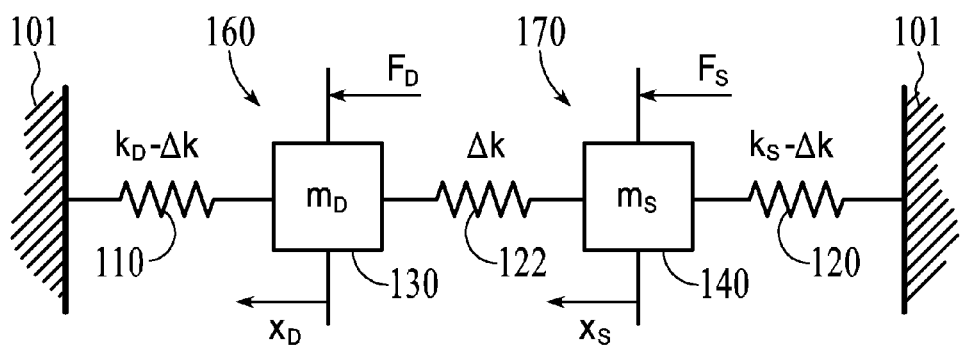

FIG. 2A depicts the uncoupled mechanical model of a sense subsystem 170 characterized by a sense resonant mode having frequency $\omega_S = \sqrt{(k_S/m_S)}$, and an uncoupled drive subsystem 160 characterized by a drive resonant mode having frequency $\omega_D = \sqrt{(k_D/m_D)}$. The sense subsystem 170 comprises mass $m_S$ 140, a sense spring 120 with stiffness $k_S - \Delta k$, and the coupling spring 122 with stiffness $\Delta k$. The drive subsystem 160 comprises a mass $m_D$ 130, a drive spring 110 with stiffness $k_D - \Delta k$, and the coupling spring 122 with stiffness $\Delta k$. The sense mass $m_S$ 140 is suspended from the substrate 101 by the sense spring 120 while the drive mass $m_D$ 130 is suspended from the substrate 101 by the drive spring 110. Referring to FIG. 2B, the sense mass $m_S$ 140 and the drive mass $m_D$ 130 are flexibly coupled through the coupling spring 122 with stiffness $\Delta k$ such that both stiffness $k_S - \Delta k$ and stiffness $k_D - \Delta k$ are greater than zero, i.e. $k_S - \Delta k > 0$ and $k_D - \Delta k > 0$. The sensing system from FIG. 2(B) yields a total of four transfer functions whose inputs are generalized forces $F_S$ and $F_D$ and outputs are motion of the particular mass, $x_S$ or $x_D$.

Figure 3:
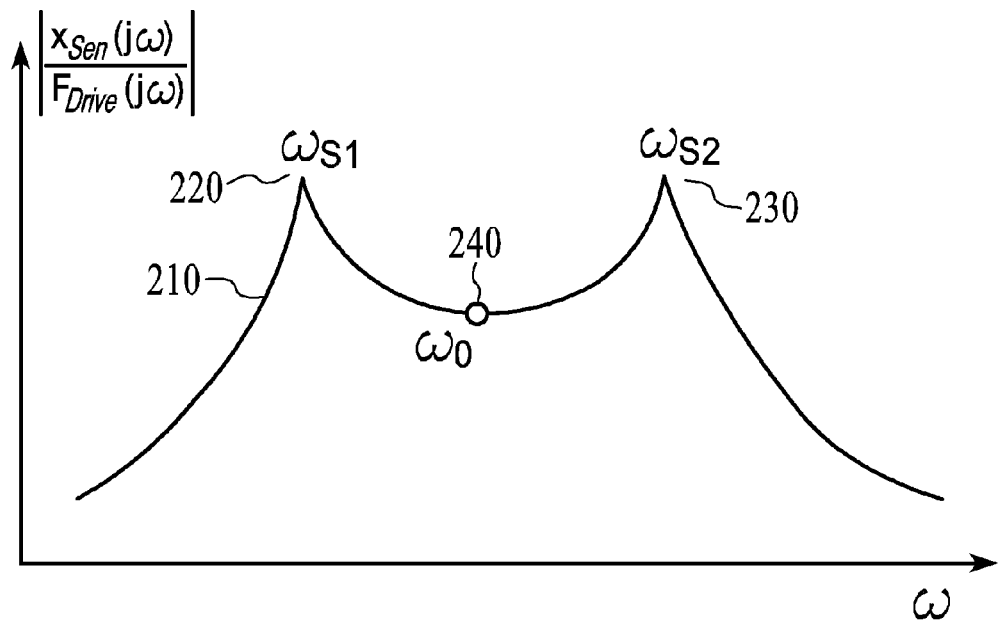
FIG. 3 is the first transfer function of the dual mode open-loop magnetometer system.

The relationship between the position of the sense mass $m_S$ 140, $x_S$, and force acting on the drive mass 130, $F_D$, can be expressed as the following transfer function:

$$G_{DS}(s) = \frac{x_S(s)}{F_D(s)} = \frac{1}{m_D m_S} \frac{\Delta k}{(s^2 + \omega_{S1}^2)(s^2 + \omega_{S2}^2)} \tag{2}$$

where $\omega_{S1}$ 220 and $\omega_{S2}$ 230 as shown in FIG. 3 are modal frequencies assigned to two vibratory modes of the system from FIG. 2(B). Similarly, the relationship between the position of the drive mass 130, $x_d$, and force acting on the sense mass 140, $F_S$, can be expressed as a yet another transfer function:

$$G_{SD}(s) = \frac{x_D(s)}{F_S(s)} = \frac{1}{m_D m_S} \frac{\Delta k}{(s^2 + \omega_{S1}^2)(s^2 + \omega_{S2}^2)} \quad (3)$$

Further, the relationship between the position of, and the force acting on either drive mass $m_D$ 130 or sense mass $m_S$ 140 can be expressed with the following transfer functions:

$$G_{SS}(s) = \frac{x_S(s)}{F_S(s)} = \frac{1}{m_S} \frac{(s^2 + \omega_D^2)}{(s^2 + \omega_{S1}^2)(s^2 + \omega_{S2}^2)} \quad (4)$$

$$G_{DD}(s) = \frac{x_D(s)}{F_D(s)} = \frac{1}{m_D} \frac{(s^2 + \omega_S^2)}{(s^2 + \omega_{S1}^2)(s^2 + \omega_{S2}^2)} \quad (5)$$

where $\omega_S$ is the anti-resonance of the sense subsystem 170 and $\omega_D$ is the anti-resonance of the drive subsystem 160.

Based on Equation (2) and (5), the force in drive subsystem results in the displacement of the drive subsystem which can be significantly smaller than the displacement of the sense subsystem for forcing frequency near $\omega_S$.

The advantages of dual-mode Lorentz-force magnetic sensing device are two-fold: stable sensitivity and low Brownian noise. Both of these advantages are described herewith.

Stable Sensitivity

Shown in FIG. 3, the first transfer functions 210 is the plot of Equation (2) which is from forces at the drive subsystem 160 of FIG. 2B to the displacement of the sense subsystem 170. In addition, it is proportional to the sensitivity of the dual mode open-loop system of FIG. 2B. Because of the existence of two subsystems, the transfer function 210 has at least two resonant peaks labeled as 220 and 230. Around the central frequency $\omega_0$ 240 which are the root-mean-square of the frequencies of the two peaks 220 and 230, the gain of the transfer function 210 is stable even with small frequency perturbation. It is desired to achieve a stable gain by designing the frequency of the AC current from the drive electronics 80 of FIG. 1 at the central frequency $\omega_0$ 240. For an open-loop system, typically the frequency of the transfer function shifts because of manufacturing-related and temperature-related variations. The design of the dual mode system of FIG. 2B operates around the central frequency $\omega_0$ 240 stabilizes the gain and mitigates the effect of manufacturing-related and temperature-related variations.

Low Brownian Noise

Figure 4:
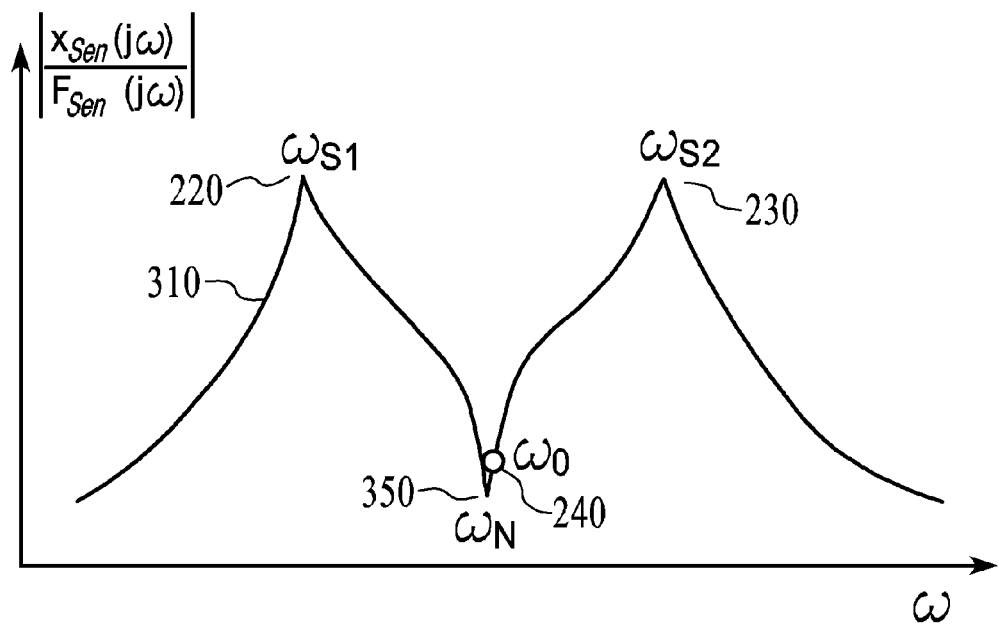
FIG. 4 is the second transfer function of the dual mode open-loop magnetometer system.

The second transfer function 310 is the plot of Equation (4) which is from forces at the sense subsystem 170 of FIG. 2A to the displacement of the sense subsystem 170 is shown in FIG. 4. The transfer function has an anti-resonance at notch frequency $\omega_N$ 350 corresponding to the drive subsystem antiresonance which can be designed to be close to the central frequency $\omega_0$ 240. The total Brownian noise output is the sum in energy of the Brownian noise output from the drive subsystem 160 and that from the sense subsystem 170. The Brownian noise output is the product of the transfer function and the Brownian noise force. In general, the Brownian noise force at the sense subsystem 170 is larger than the Brownian noise force at the drive subsystem 160. By incorporating the anti-resonance of the transfer function 310, the Brownian noise output is minimized and the dual mode open-loop system 2 can achieve low Brownian noise.

The coupling spring 122 is important to the operation of a dual mode open-loop system. The frequency of two resonant peaks labeled as 220 and 230 of the transfer function 210 may be calculated as:

$$\omega_{220}^2 = \omega_0^2 \left(1 - \frac{\Delta k}{\sqrt{k_D k_S}}\right) \quad (6)$$

$$\omega_{230}^2 = \omega_0^2 \left(1 + \frac{\Delta k}{\sqrt{k_D k_S}}\right)$$

where $k_S$, $k_D$ and $\Delta k$ are the stiffness of the sense subsystem 170, the drive subsystem 160, and the coupling spring 122 and this stiffness define frequency separation between 220 and 230. Coupling stiffness $\Delta k$ may be substantially large in order to separate peaks, yielding wider sensor bandwidth. On the other hand, coupling stiffness $\Delta k$ may be substantially small to keep peaks close to achieve high transducer gain.

The coupling element 122 can be implemented as structural coupling springs or electrostatic coupling springs.

Structural Coupling Springs

Figure 5:
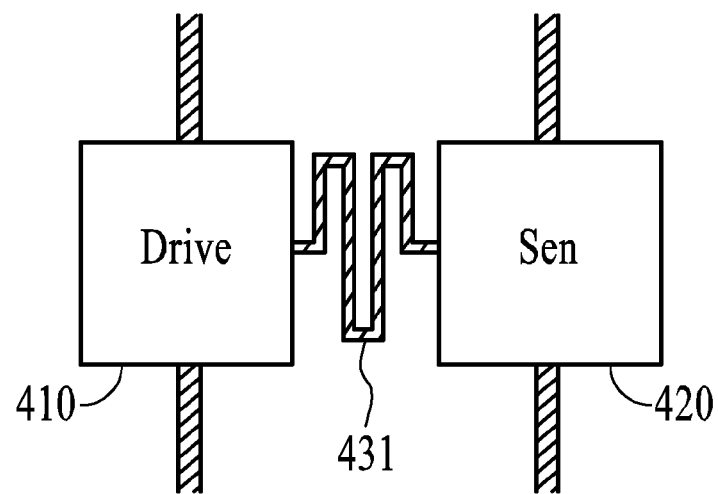
FIG. 5 is the embodiment of a mechanical coupling spring.

An embodiment of a structural coupling spring 431 is shown in FIG. 5. The spring 431 includes folded beams where the stiffness of the structural coupling spring 431 is defined by the structural width, length, height, and material properties. In some cases, the sense point is preferred to be electrically isolated from the drive point 410. For example, the sense point 420 can be biased at high voltage to increase the transduction gain of the position transducer 40 (FIG. 1) while the drive point 410 is biased at a low voltage that is limited by the drive electronics 80 (FIG. 1). In this case, the material of the structural coupling spring 431 can be designed to be highly resistive or an additional dielectric layer can be inserted in the structural coupling spring 431. However, a complicated process with at least one extra mask is required to establish low resistance structures for the drive subsystem 60 (FIG. 1) and high resistance structures or structures with a dielectric layer for the coupling spring 431.

Electrostatic Coupling Springs 30

Electrostatic coupling springs can be designed for different mechanical movements, i.e., in-plane movement or out-of-plane movement.

Figure 6:
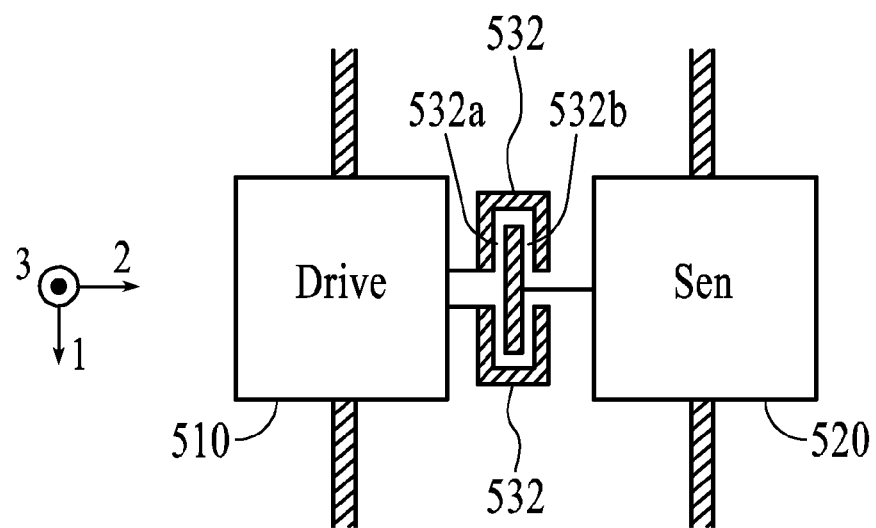
FIG. 6 is the embodiment of an electrostatic coupling spring.

In-plane Electrostatic Coupling Springs:

An embodiment of electrostatic coupling spring 532 is shown in FIG. 6. In the case of in-plane motion of the drive point 510 referenced to the sense point 520 along the second axis, the electrostatic coupling spring 532 includes electrostatic parallel plates with electrode gaps 532a and 532b, respectively. The in-plane coupling stiffness $\Delta k$ can be modeled as $$\Delta k \propto \frac{-2\varepsilon A}{g^3} V^2 \quad (7)$$

where the $\in$, A, g, and V are the permittivity, electrode area, electrode gap, and bias voltage across the in-plane electrostatic coupling spring 532. The polarity of the in-plane coupling stiffness indicates that the in-plane electrostatic coupling spring is a negative spring and the total stiffness and the resonant frequency are reduced.

Out-of-plane Electrostatic Coupling Springs:

The embodiment of the electrostatic coupling spring 532 shown in FIG. 6 can be deployed for out-of-plane motion coupling. In the case of out-of-plane motion of the drive point 510 referenced to the sense point 520 along the third axis, the electrostatic coupling spring 532 acts as interdigitated combs. A typical device can be built with height ranging from 10 microns to 100 microns and a typical gap can vary from 1 micron to 5 microns. For a structural height of 30 microns and the gap of 2 microns, the out-of-plane coupling stiffness $\Delta k$ can be modeled as $$\Delta k \propto n \frac{\pi^3}{20} \frac{\varepsilon L o v}{g^2} V^2 \qquad (8)$$

where the n, Lov, g, and V are the number of combs, comb overlap length, electrode gap, and bias voltage across the out-of-plane electrostatic coupling spring 532. The polarity of the out-of-plane coupling stiffness indicates that the out-of-plane electrostatic coupling spring is a positive spring and the total stiffness and resonant frequency are increased.

The advantages of electrostatic coupling springs are two-fold. The first advantage is the high impedance at DC between the drive point 510 and the sense point 520. Thus, the sense point 520 can be biased at high voltage to increase the transduction gain of the position transducer 40 (FIG. 1) without any complicated process mentioned in the section of the structural coupling spring 431 (FIG. 5). The second advantage of the electrostatic coupling springs is that a weak stiffness is easily provided. As mentioned before, that coupling stiffness $\Delta k$ may be substantially small to keep resonant peaks 220 and 230 of FIG. 4 close to achieve high transducer gain. This could be problematic when utilizing a structural coupling spring 431 which may require a long and slender structure and may result in undesired low-frequency resonant modes. In the case of electrostatic coupling spring 532, a small stiffness can be achieved by reducing the electrode area for the in-plane electrostatic coupling spring 532 and shortening the comb overlap length for the out-of-plane electrostatic coupling spring 532.

Figure 7:
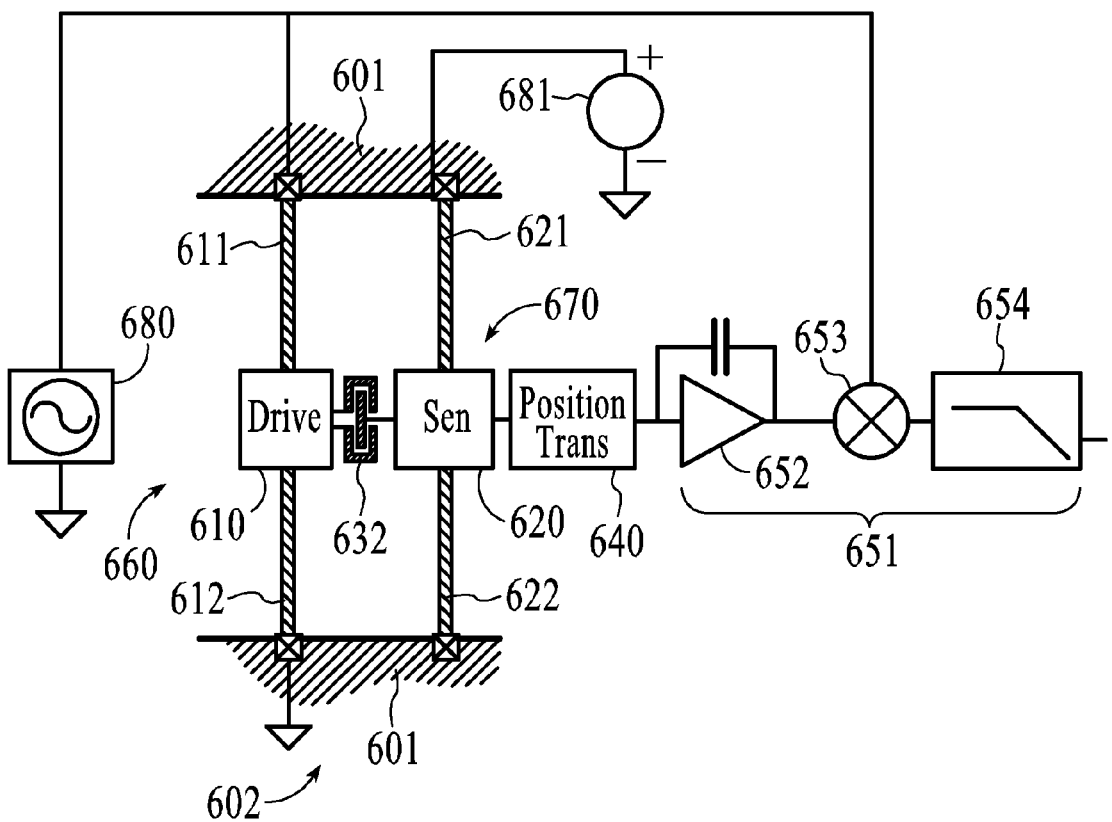
FIG. 7 is the embodiment of open-loop dual-mode Lorentz-force magnetic sensing device with signal processing circuitry.

Because of its stable gain and low noise floor, the circuitry requirement for the dual mode open-loop system is not complex and simple signal processing circuitry can be employed. Shown in FIG. 7, a signal processing unit 651 in accordance with an embodiment comprising a charge-to-voltage converter 652, a de-modulator 653, and a low-pass filter 654 is coupled to the dual mode system 602. The charge-to-voltage converter 652 converts the output of the position transducer 640 into a voltage format. The de-modulator 653 down-converts the AC output signals of the charge-to-voltage converter 652 into a low frequency. The low-pass filter 654 reduces the high frequency noise and might serve as an anti-aliasing filter prior digitization. In addition, the electrostatic coupling spring 632 is deployed with a high voltage bias 681 to the sense subsystem 670 resulting in high transduction gain of the position transducer 640 mentioned before. The examples noted here should not be interpreted to restrict the range of possible signal processing circuitry of the dual mode open-loop system. One of ordinary skill in the art readily recognizes a variety of types of signal processing circuitry can be utilized and that use would be within the spirit and scope of the present invention.

Figure 8:
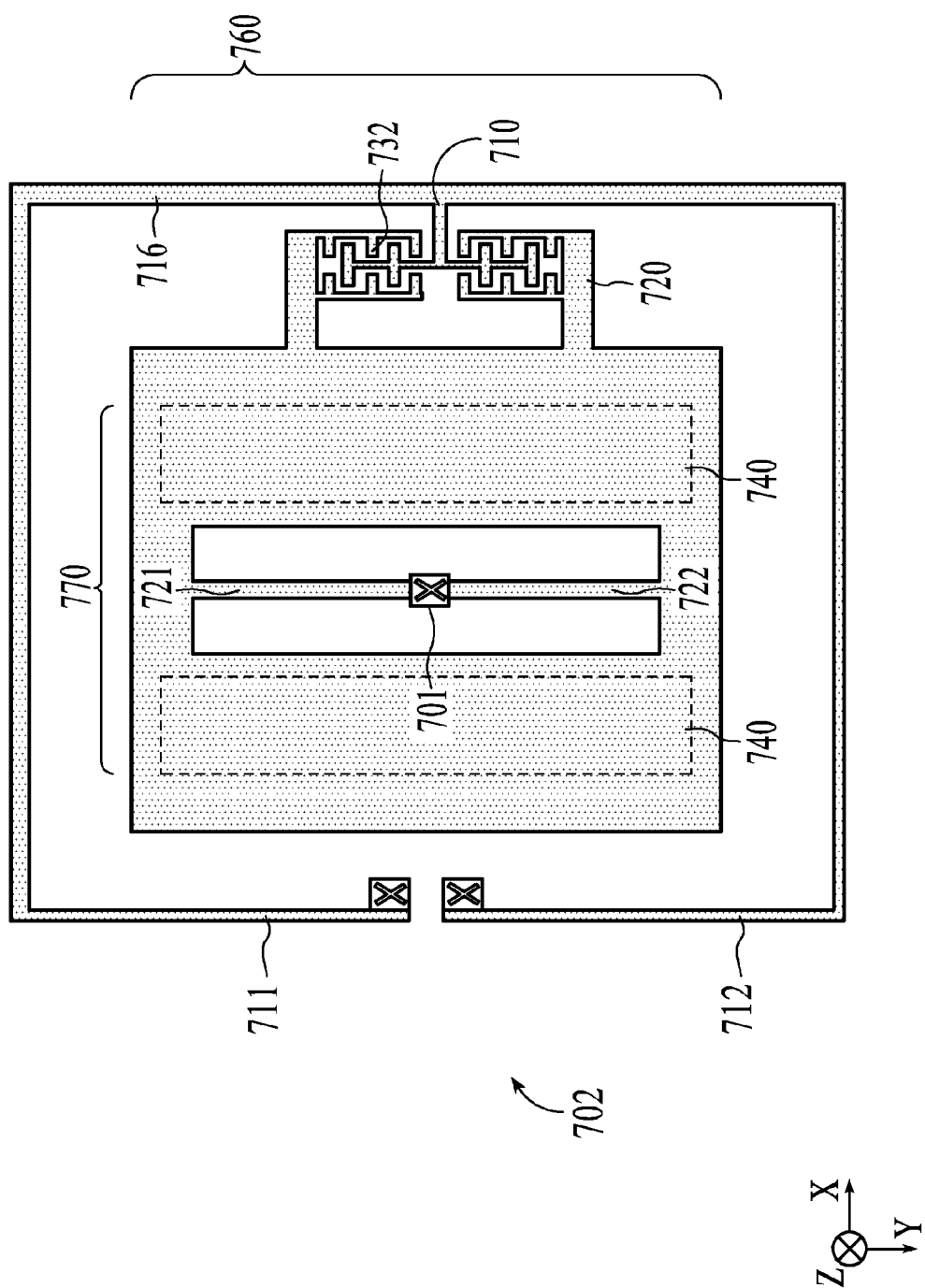
FIG. 8 is the embodiment of open-loop dual-mode Lorentz-force magnetic sensing device for sensing in-plane magnetic fields.
Figure 9:
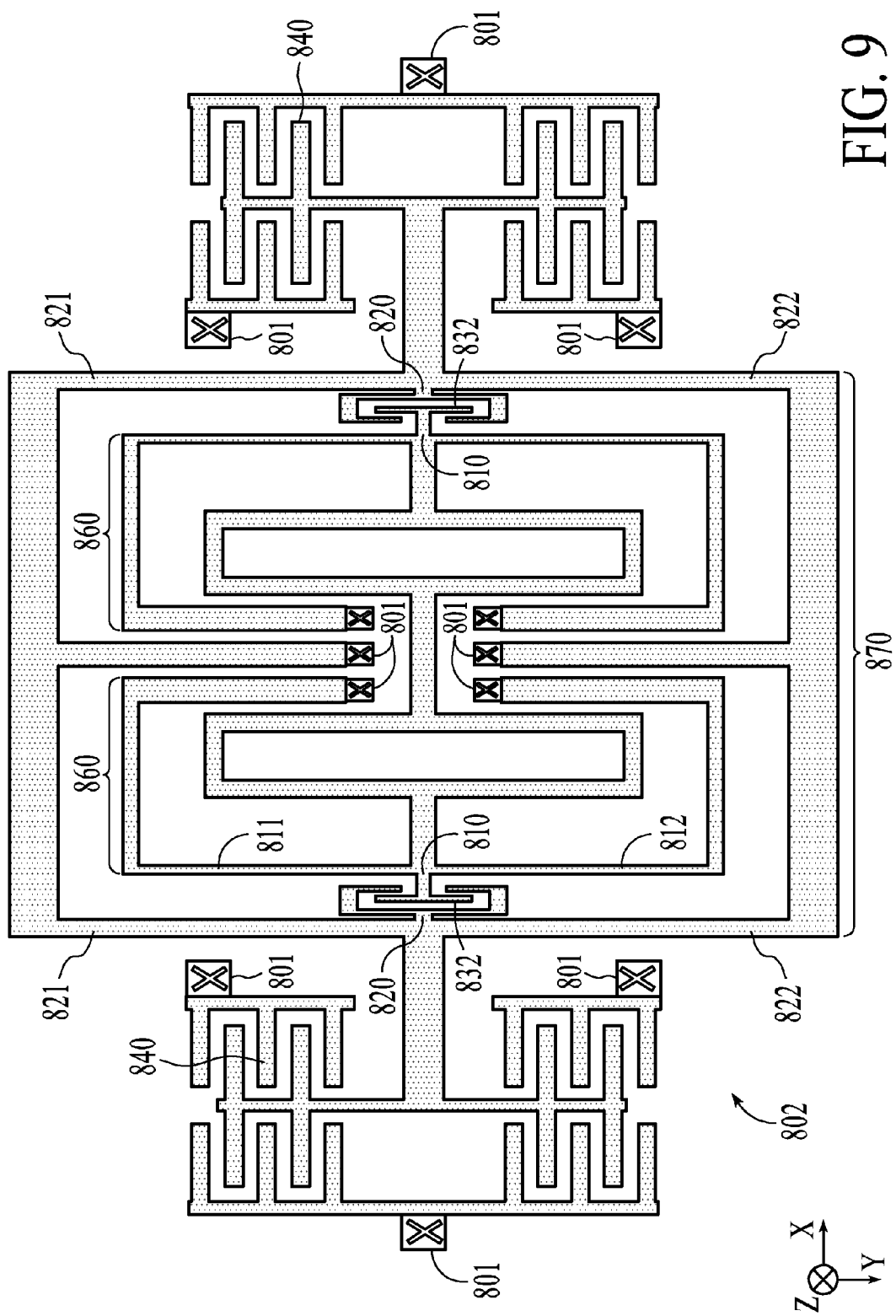
FIG. 9 is an embodiment of open-loop dual-mode Lorentz-force magnetic sensing device for sensing out-of-plane magnetic fields.

Embodiments for in-plane and out-of-plane dual mode open-loop systems are shown in FIGS. 8 and 9.

For an in-plane dual mode open-loop system 702, a drive point 710 and a sense point 720 are mechanically anchored to a substrate 701 through a plurality of beams 711, 712 and 721, 722, respectively.

In the drive subsystem 760, an AC current generated by the drive electronics 80 of the FIG. 1 passes through a plurality of beams 711, a drive point 710, and a plurality of beams 712. In the presence of a magnetic field vector in X-axis, the Lorentz force generates a distributed actuation force in Z-axis along a drive beam 716 and the total force can be modeled as $$F_{Lorentz,Z} = \int (I_Y \times B_X) dl \qquad (9)$$

where the $I_Y$ is the current vector in Y-axis and $B_X$ is the magnetic field vector in the X-axis.

The Lorentz force actuates the drive subsystem 760 and the drive point 710 and generates an out-of-plane displacement in Z-axis which is proportional to the magnetic field density. An out-of-plane electrostatic coupling spring 732 transfers the displacement of the drive point 710 to the sense point 720 via its mechanical stiffness and actuates the sense subsystem 770 into a rotational motion in Y-axis. The rotational motion of the sense subsystem 770 is detected by parallel plate capacitive transducers 740 located beneath the sense subsystem 770 as the position transducer 740 and the electrical signals from the position transducer 740 is further processed by the signal processing unit 50 shown in FIG. 1.

For an out-of-plane dual mode open-loop system 802, a drive subsystem 860 and a sense subsystem 870 are mechanically anchored to a substrate 801 through a plurality of beams 811, 812, 821, and 822, respectively.

In the drive subsystem 860, an AC current generated by the drive electronics 80 of the FIG. 1 passes through a plurality of beams 811, a drive point 810, and a plurality of beams 812. In the presence of a magnetic field vector in Z-axis, the Lorentz force generates a distributed actuation force in X-axis along a plurality of beams 811 and 812. The total force may be modeled as (10)

$$F_{Lorentz,X} = \int (I_Y \times B_Z) dl \qquad (10)$$

where the $I_Y$ is the current vector in Y-axis and $B_Z$ is the magnetic field vector in the Z-axis. The Lorentz force actuates the drive point 810 and generates an in-plane displacement in X-axis and the magnitude of the displacement is proportional to the magnetic field density. The motions of the drive subsystem 860 and the sense subsystem 870 are coupled through an in-plane electrostatic coupling spring 832.

The in-plane electrostatic coupling spring 832 transfers the displacement of the drive point 810 to a sense point 820 via its mechanical stiffness and actuates the sense subsystem 870 and the sense point 820. The motion of the sense subsystem 870 is detected by interdigitated comb capacitive transducers 840 as a position transducer and the electrical signals from the position transducer 840 is further processed by the signal processing unit 50 shown in FIG. 1.

A Multi-axis Magnetic Sensing System

Figure 10:
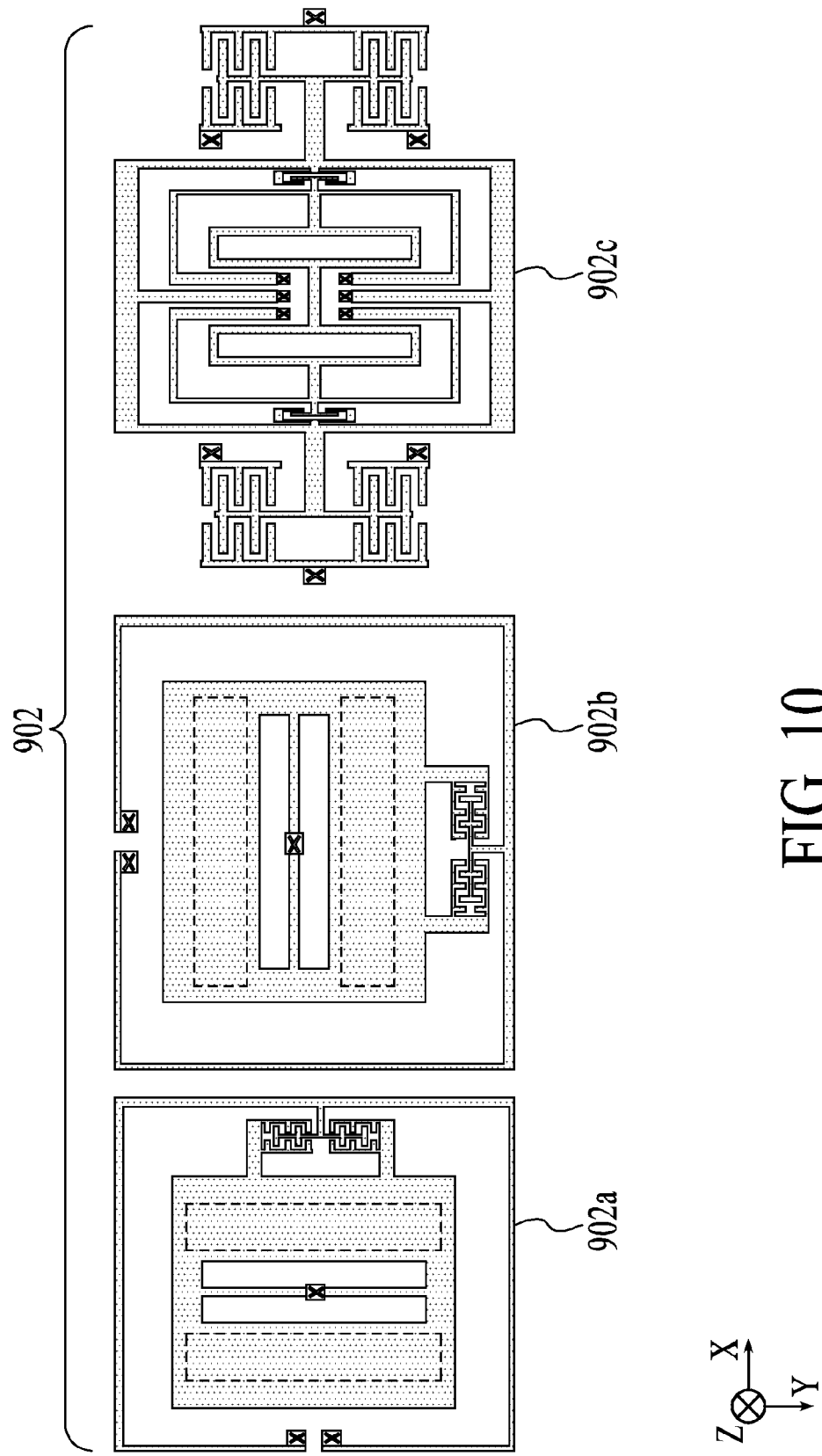
FIG. 10 is an embodiment of 3-axis magnetic sensing system with 3 open-loop dual-mode Lorentz-force magnetic sensing devices.

A multi-axis magnetic sensing system 902 can be constructed from the disclosed open-loop dual mode Lorentz-force magnetic sensing devices and is shown in FIG. 10. Magnetic field sensors 902a, 902b, and 902c are deployed for sensing x-axis, y-axis, and z-axis portion of the magnetic field vector, respectively.

The Z-axis micromachined magnetic field sensor 902c, wherein the Z-axis micromachined magnetic field sensor comprises a drive subsystem, the drive subsystem comprises a plurality of beams, and at least one anchor connected to the substrate; a mechanism for providing an electrical current through the drive subsystem in a X-Y plane; and Lorentz force acting on the drive subsystem in the X-Y plane in response to a magnetic field along a Z axis; a sense subsystem, the sense subsystem comprises a plurality of beams, and at least one anchor connected to the substrate; wherein the sense subsystem moves in the X-Y plane; a coupling spring between the drive subsystem and the sense subsystem which causes motion of the sense subsystem in response to the magnetic field; and a position transducer to detect the motion of the sense subsystem.

The X-axis micromachined magnetic field sensor 902a, wherein the X-axis micromachined magnetic field sensor comprises a drive subsystem, the drive subsystem comprises a plurality of beams, and at least one anchor connected to the substrate; a mechanism for providing an electrical current through the drive subsystem in the X-Y plane; and Lorentz force acting on the drive subsystem along the Z-axis in response to a magnetic field along the X-axis; a sense subsystem, the sense subsystem comprises a plurality of beams, and at least one anchor connected to the substrate; wherein the sense subsystem moves partially along the Z-axis; a coupling spring between the drive subsystem and the sense subsystem which causes motion of the sense subsystem in response to the magnetic field; and a position transducer to detect the motion of the sense subsystem.

The Y-axis micromachined magnetic field sensor 902b, wherein the Y-axis micromachined magnetic field sensor comprises a drive subsystem, the drive subsystem comprises a plurality of beams, and at least one anchor connected to the substrate; a mechanism for providing an electrical current through the drive subsystem in the X-Y plane; and Lorentz force acting on the drive subsystem along the Z-axis in response to a magnetic field along the Y axis; a sense subsystem, the sense subsystem comprises a plurality of beams, and at least one anchor connected to the substrate; wherein the sense subsystem moves partially along the Z-axis; a coupling spring between the drive subsystem and the sense subsystem which causes motion of the sense subsystem in response to the magnetic field; and a position transducer to detect the motion of the sense subsystem. The method of establishing an open-loop dual mode Lorentz-force magnetic sensing device noted here should not be interpreted to restrict the range of possible multi-axis magnetic sensing systems. To form a multi-axis magnetic sensing system, the proposed open-loop dual mode Lorentz-force magnetic sensing device can be integrated with magnetic sensors consisting of Hall sensors, magnetoresistive sensors, magneto-diode sensors, magneto-transistors, fluxgates, magneto-impedance sensors, magneto-optical sensors, and MAGFETs.

Self-Test Function

A self-test function is important and is commonly implemented as a current-carrying coil to generate magnetic fields through the Ampere Law. However, it consumes significant power as high as several milli-watt. For example, 3-axis digital compass HMC5843 manufactured by Honeywell Corporation consumes 3 mA current to generate a 30 uT magnetic field (comparable to the earth magnetic field).

Figure 11C:
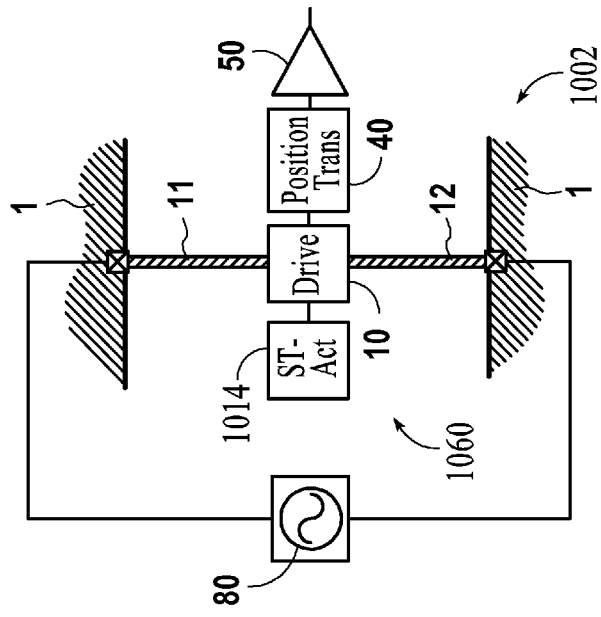
FIGS. 11A-11C are embodiments of a self-test actuator with a magnetometer system (a) for a dual mode system; (b) an implementation with electrostatic comb self-test actuators; (c) for a single mode system.
Figure 11A:
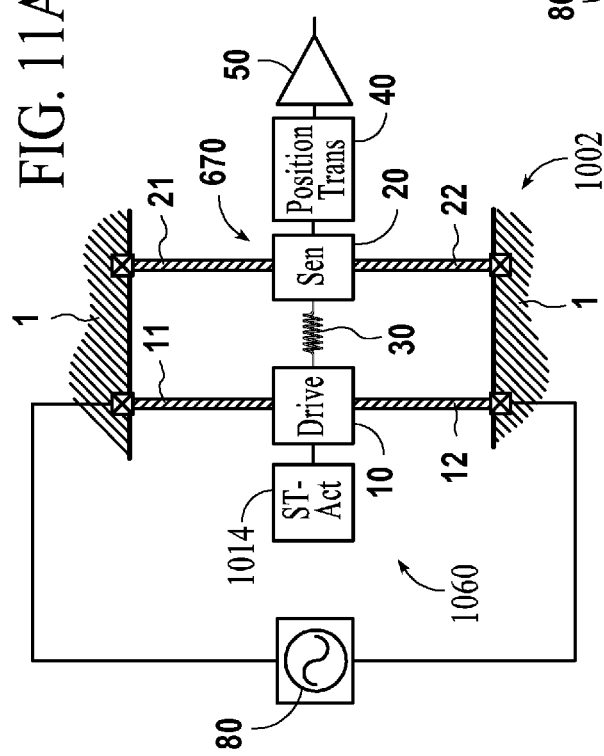

FIG. 11A is an embodiment of the self-test function which includes a self-test actuator 1014 which connects to a drive subsystem 1060. In the self-test mode, the self-test actuator 1014 excites the drive subsystem 1060 and generates output via the first transfer function 210 of FIG. 3. The self-test actuator 1014 can be designed with mechanisms comprising parallel plate capacitive transducers, interdigitated comb capacitive transducers, electro-thermal actuators, and piezo-electric actuators.

Figure 11B:
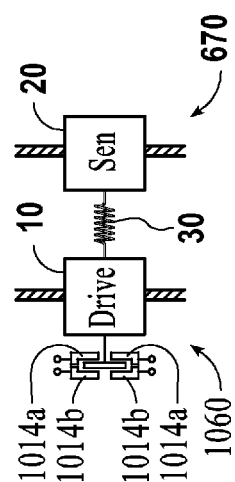

An embodiment of parallel plate capacitive transducers 1014a and 1014b as the self-test actuator 1014 is shown in FIG. 11B. In the self-test mode, the voltage of either capacitive transducers 1014a or 1014b biased at a self-test voltage which is different from the voltage of the drive subsystem 1060. The voltage difference results in an electrostatic force which actuates the dual mode open-loop system 1002. The method of establishing a self-test actuator 1014 for a magnetic sensing device noted here should not be interpreted to restrict the range of possible application. An embodiment of the self-test function with the self-test actuator 1014 for a single mode magnetic sensing device 1002 is shown in FIG. 11C.

In the case of the implementation of a parallel plate capacitive actuator as the the self-test actuator 1014, the equivalent magnetic field density is $$B_{Equivalent} = \frac{\frac{\varepsilon A_{ST}}{g_{ST}^2} V_D}{\int_{L_D} I \cdot dl} V_{ST} \tag{11}$$

where $A_{ST}$, $g_{ST}$, $V_D$, $V_{ST}$, I, and $L_D$ are the parallel plate area, parallel plate gap, the DC voltage of the drive subsystem 1060, a self-test voltage, current flow across the drive subsystem 1060 and the effective beam length of the drive subsystem 1060. With 30 um×2.8 um of the parallel plate area, 5 um of the capacitive gap, biased at 1 voltage of the drive subsystem 1060, supplying 0.5 voltage of self-test voltage across the parallel plate creates a equivalent force of 30 uT magnetic density when the drive subsystem 1060 is within 500 um of the effective beam length of the drive subsystem 1060 and 1 mA of the driving AC current.

The advantage of the proposed self-test function in terms of lowering power consumption is dramatic. Compared with several milliwatts of the power consumption for the prior art, the power consumption for voltage across the capacitor of the self-test actuator 1014 is negligible.

Figure 11D:
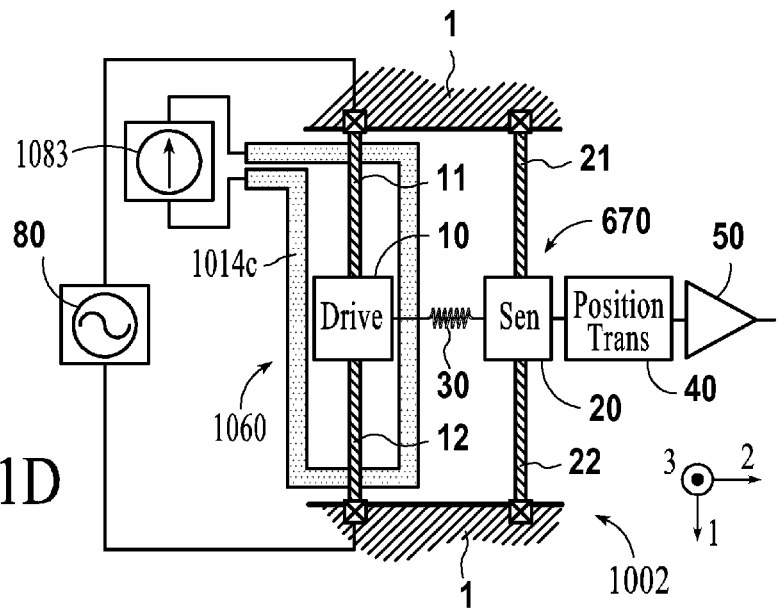
FIGS. 11D and 11E are embodiments of a dual mode open loop system and a single mode open loop system, respectively that includes current carrying coils.
Figure 11E:
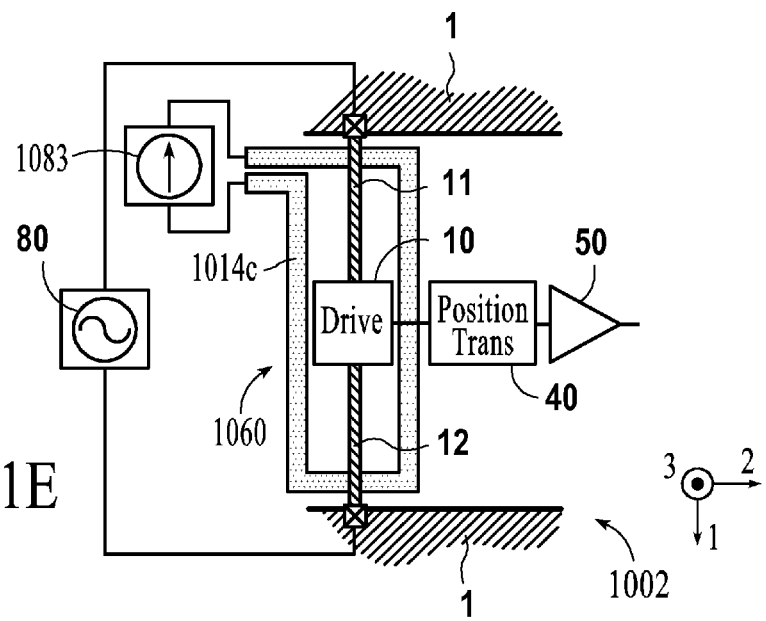

The examples noted here should not be interpreted to restrict the range of possible integration of the dual mode or single mode open-loop system with current-carrying coils to generate a magnetic field via the Ampere Law. FIGS. 11D and 11E are embodiments of a dual mode open loop system and a single mode open loop system respectively that includes current carrying coils 1014c. The current-carrying coils 1014c each generate a magnetic field along the third axis which interacts with the drive subsystem resulting in Lorentz force acting on the drive subsystem along the second axis.

To overcome process variation, frequency tuning is critical to ensure high signal to noise ratio. As before mentioned with reference to FIG. 4, sensitivity is proportional to the first transfer function 210 and small frequency separation between two resonant peaks labeled as 220 and 230 leads to high sensitivity. In addition, the second transfer function 310 is related to the total Brownian noise. Ideally, by operating the dual mode open-loop system 2 (FIG. 1) at the anti-resonance $\omega_N$ 350 of the transfer function 310, the Brownian noise output is minimized.

However, because of manufacturing variation resulting in changes in structure stiffness, the frequency separation two resonant peaks 220 and 230 could be widened leading to low sensitivity and the anti-resonance $\omega_N$ 350 of the transfer function 310 is pulled close to the one of the resonant peaks leading to high sensitivity variation. These outcomes degrade signal to noise ratio.

Stiffness Tuning Block

Figure 12C:
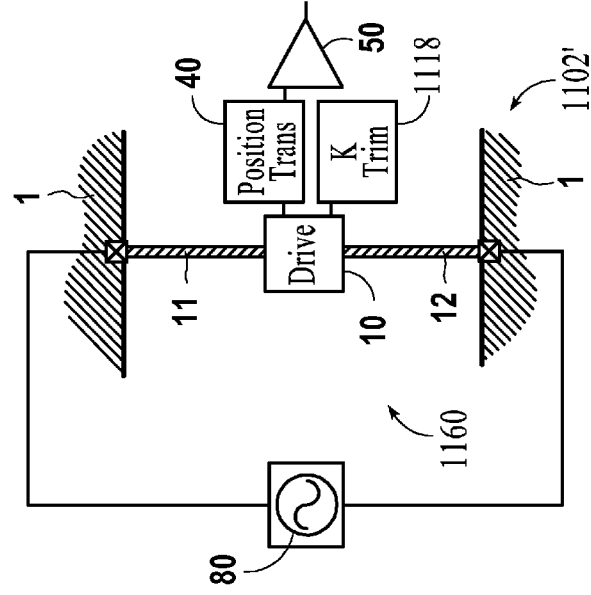
FIGS. 12A-12C are embodiments of a stiffness trimming block with a magnetometer system; (a) an embodiment for a dual mode system; (b) an implementation with electrostatic parallel plate actuators as the stiffness trimming block; (c) an embodiment for a single mode system.
Figure 12A:
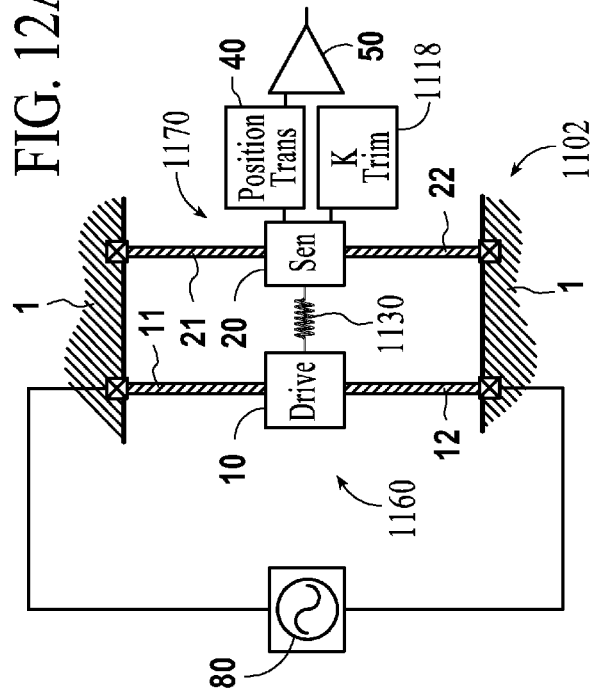
Figure 12B:
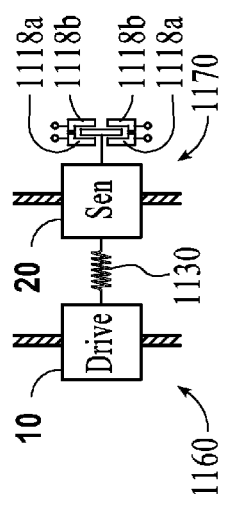

A stiffness tuning block 1118 for a dual mode open-loop system 1102 is proposed to address the effect of stiffness variation, shown in FIG. 12A. Shown in Equation (6), the frequency separation between 220 and 230 is a function of the stiffness of a drive subsystem 1160, a sense subsystem 1170, and a coupling spring 1130. Thus, the transfer function 210 and 310 and the resonant peaks 220 and 230 can be tuned by changing either the stiffness of the drive subsystem 1160, or the sense subsystem 1170, or the coupling spring 1130. An embodiment of a stiffness tuning block 1118 to tune the stiffness and frequency of the sense subsystem 1170 for a dual mode open-loop system 1102 is shown in FIG. 12A. An example of electrostatic parallel plates 1118a and 1118b as the stiffness tuning block is shown in FIG. 12B. The tuning stiffness $\Delta k_T$ of the electrostatic parallel plates 1118a and 1118b can be modeled as Equation (7) where A, g, and V are the area of parallel plates 1118a and 1118b, electrode gap, and bias voltage across the parallel plates 1118a and 1118b. Thus, during calibration, the bias voltage across the parallel plates can be tuned and the tuning stiffness $\Delta k_T$ from the stiffness tuning block changes the stiffness of the sense subsystem 1170 and ensure the frequency separation and the anti-resonance $\omega_N$ 350 of the transfer function 310 matches the design values.

The application of the stiffness tuning block 1118 is not limited to the embodiment shown in FIGS. 12A and 12B. Other tuning mechanism such as thermal actuators or piezoelectric actuators can be applied as an implementation of the stiffness tuning block 1118. In addition, a similar frequency tuning block can be applied to change the stiffness of the drive subsystem 1160 or the coupling spring 1130. An example of the stiffness tuning block 1118 for single mode magnetic field sensing system 1102' is shown in FIG. 12C.

Offset Cancellation

Resonant sensing systems are prevalent for their high sensitivity and the application ranges from magnetic field sensors, gyroscopes, accelerometers, chemical sensors, biosensors, pressure sensors, to force sensors. However, for resonant sensing systems with AC drive signals, the interactions between drive signals and the surrounding parasitic capacitors generates electrostatic offset forces and thus creates unwanted feedthrough outputs, or called offset. In general, the offset is larger than the signal generated by the field of interest. Thus, the offset variation may limit the minimum detectable signal level and the design to mitigate offset is critical.

Figure 13A:
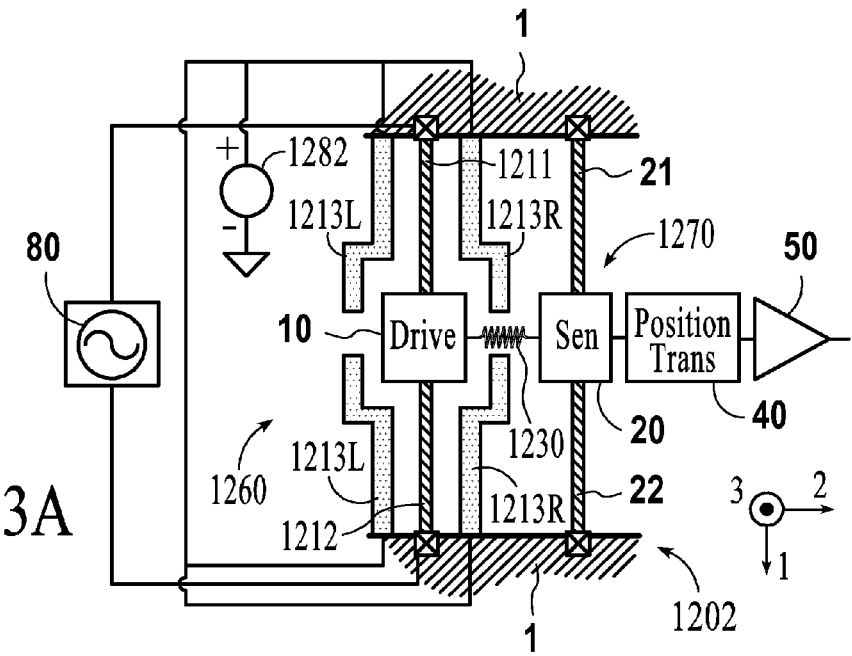
FIGS. 13A and 13B are embodiments of a shield structure with (a) a dual mode open-loop magnetometer system; and (b) a single mode open-loop magnetometer system.

For resonant magnetic field sensors, the first offset source is the electrostatic force from the shield structure. Shown in FIG. 13A, a dual mode open-loop system 1202 with shield structure comprising an electrical source 1282, and at least one electrode, as 1213R and 1213L, to reduce the electrostatic offset force along the second axis generated by parasitic capacitors around a drive subsystem 1260. The equivalent offset from the electrostatic force generated by the shield electrodes is expressed $$B_{offset,SH} \propto \left( \frac{H_{SH,L}}{g_{SH,L}^2} - \frac{H_{SH,R}}{g_{SH,R}^2} \right) \Delta V_{D,SH} \int_{L_D} \frac{\Delta V_{AC}}{l} \cdot dl \quad (12)$$

where $H_{SH}$, $g_{SH}$, $\Delta V_{D,SH}$, and $\Delta V_{AC}$ are the height of the shield electrode, the gap of the shield electrode, and the DC voltage difference between the drive subsystem 1260 and the electrical source 1282 of the shield electrode, the AC voltage difference between the drive subsystem 1260 and the electrical source 1282 of the shield electrode. The label L or R of the height and the gap of the shield electrode indicates the left-side 1213L or right-side of the shield 1213R, respectively.

Offset Mitigation with Shield Structure with Force-Balanced Characteristic

The force-balanced shield structure is implemented with two equal shield heights $H_{SH}$ and gaps $g_{SH}$ of the left-side shield 1213L and right-side shield 1213R. Thus, the electrostatic forces generated by the left shield 1213L is balanced by the force generated by the right-side shield 1213R and the first term of Equation (11) is cancelled in the first order resulting in small offset.

Offset Mitigation with Voltage Tuning of Shield Structure

However, due to manufacturing imperfection of mismatched shield height or shield gap, there is residue offset even with the design of the force-balanced shield structure. Additional cancellation can be achieved by tuning the voltage of the shield structure to null the DC voltage difference $\Delta V_{D,SH}$ between the drive subsystem 1260 and the shield electrodes 1213R and 1213L. Thus, the second term of Equation (12) is cancelled resulting in small offset.

Offset Mitigation with Balanced AC Voltage Distribution

Additional cancellation can be achieved by designing the distribution of the AC voltage of the drive subsystem 1260. The effective beam length $L_D$ of the drive subsystem 1260 is the length of a plurality of beams 1211 and 1212. By having the same length of a plurality of beams 1211 and 1212 and applied same magnitude but opposite polarity of AC voltage distribution across the drive subsystem 1260, the third term of equation (12) is cancelled resulting in small offset.

Figure 13B:
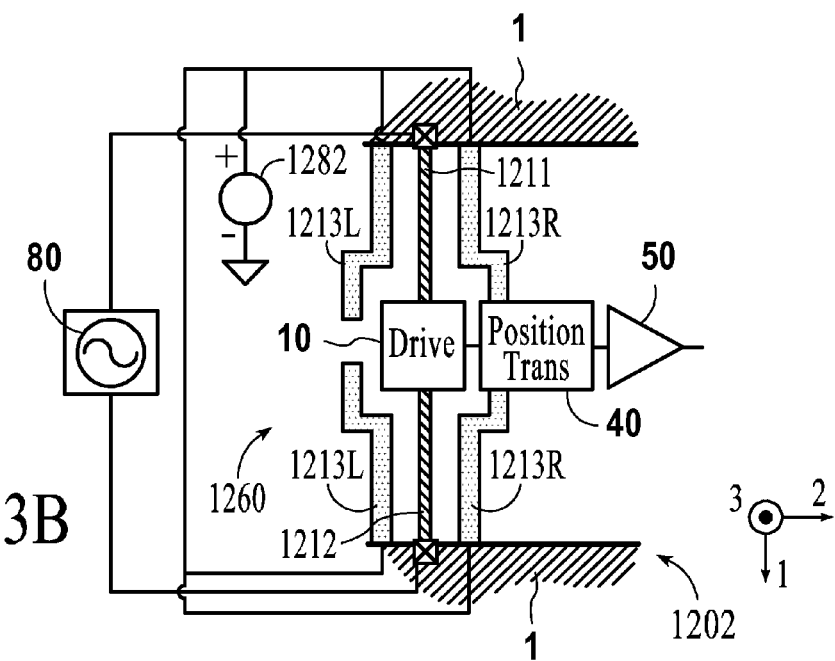

The examples noted here should not be interpreted to restrict the range of possible application of the offset mitigation technique with shield structure. An embodiment of the offset mitigation with shield structures for a single mode system 1202 with shield structures 1213R and 1213L across a drive subsystem 1260, as shown in FIG. 13B.

A second offset source is the electrostatic force through the electrostatic coupling spring. The second offset source results from an AC electrostatic force generated by AC voltage across the electrostatic coupling spring element. The offset can be modeled as $$B_{offset,C} \propto \left( \frac{A_{C,L}}{g_{C,L}^2} - \frac{A_{C,R}}{g_{C,R}^2} \right) \Delta V_{DS} \Delta V_{AC,C} \quad (13)$$

where $A_C$, $g_C$, $\Delta V_{DS}$, and $\Delta V_{AC,C}$ are the area of the coupling spring, the gap of the coupling spring, the DC voltage difference between the drive subsystem 1260 and the sense subsystem 1270, the AC voltage difference at the coupling point between the drive subsystem 1260 and the sense subsystem 1270, and the label L or R of the area and the gap of the coupling spring 1230 indicates the two side of the coupling spring.

Offset Mitigation with Force-balanced Coupling Spring

Shown in FIG. 6, a force-balanced coupling spring 532 for in-plane coupling is implemented with two equal coupling area and gaps of 532a and 532b. Thus, the electrostatic force generated by the left electrode 532a is balanced by the force generated by the right-side electrode 532b and the first term of Equation (13) is cancelled in the first order resulting in small offset. The same force-balance technique can be applied to the out-of-plane coupling spring 532.

Offset Cancellation with Mismatch-trimming Actuator

Figure 14C:
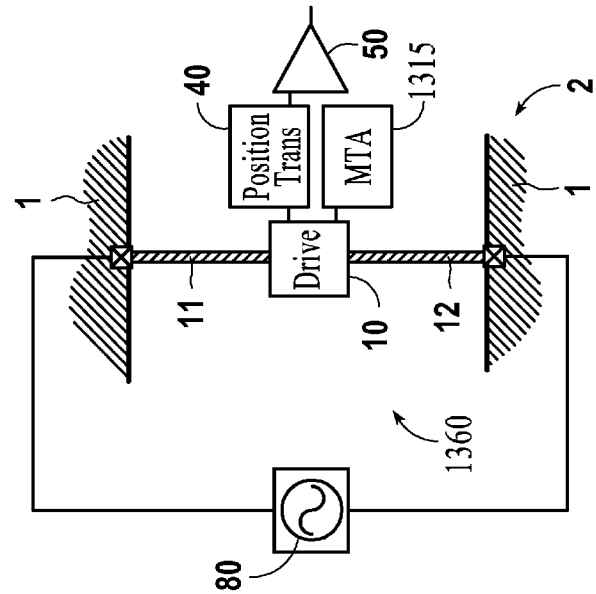
FIG. 14A-14C are embodiments of a dual mode open-loop magnetometer system with a) a mismatch-trimming actuator (MTA), (b) an embodiment of MTA, and (c) an MTA embodiment with a single mode open-loop magnetometer system.
Figure 14A:
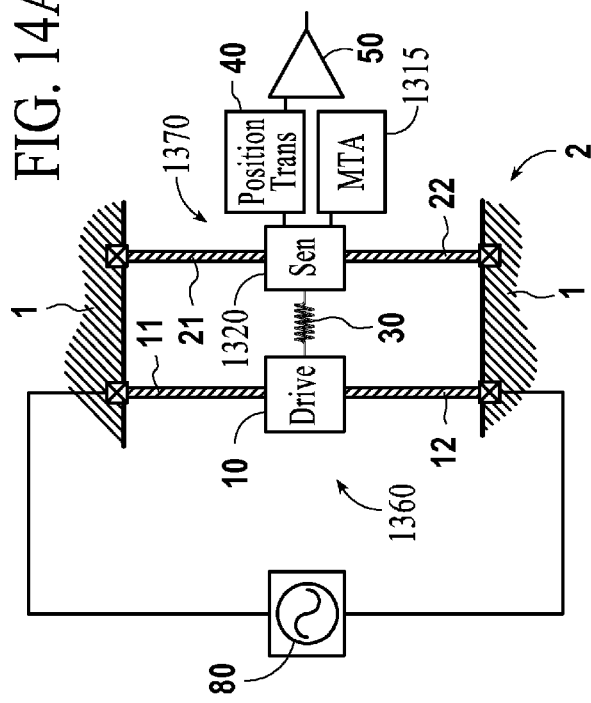

However, due to manufacturing imperfection of mismatched gap, there is residue offset even with force-balanced coupling spring where the residue offset is proportional to the mismatch. Shown in FIG. 14A, a mismatch-trimming actuator (MTA) 1315 is implemented to move a sense subsystem 1370 in order to reduce the gap mismatch. The MTA 1315 can be designed with mechanisms comprising parallel plate capacitive transducers, interdigitated comb capacitive transducers, electro-thermal actuators, and piezoelectric actuators.

Figure 14B:
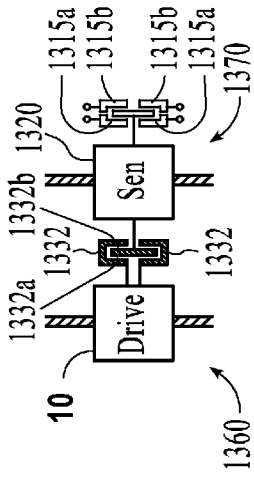

An embodiment of parallel plate capacitive transducers as MTA 1315 is shown in the FIG. 14B. The displacement of the electrostatic actuation can be expressed as $$\Delta x_{MTA} \propto \frac{A_{MTA}}{g_{MTA}^2 K_S}[(V_s - V_{MTA,15a})^2 - (V_s - V_{MTA,15b})^2] \quad (14)$$

where $A_{MTA}$, $g_{MAT}$, $V_{MTA}$, $V_S$ and $K_S$, are the area of the MTA, the gap of the MTA, the applied voltage at MTA, the voltage of a sense point 1320, and the stiffness of the sense subsystem 1370. In a mismatch case that the gap 1332b of the in-plane coupling spring 1332 is larger than gap 1332a, by applying the voltages of MTA 1315a higher than MTA 1315b and assuming Vs is larger than both voltages, the electrostatic actuation force of MTA 1315b is larger than that of the MTA1315a and moves the sense node 1320 and the sense subsystem 1370 toward the MTA 1315b. Thus, the mismatch can be null. With the same concept, the MTA technique can be applied to out-of-plane coupling spring 1332 with the implementation of such as out-of-plane parallel plate capacitive transducers.

Furthermore, a mismatch-trimming actuator (MTA) 1315 can be applied to reduce the shield gap mismatch. Shown in FIG. 14C, a mismatch-trimming actuator (MTA) 1315 is implemented to move the drive subsystem 1360 in order to reduce the shield gap mismatch. Thus, the first term of Equation 12 for offset caused by shield structure can be further reduced.

Offset Cancellation with AC Ripple Detection

The ideal coupling location for the electrostatic coupling spring is at AC ground because the AC voltage difference $\Delta V_{AC,C}$ is zero at the location. Therefore, the offset generated by electrostatic force across the electrostatic coupling spring is zero shown in Equation (13). However, due to manufacturing imperfection of resistance variation, there is ripple at the coupling point resulting in residue offset proportional to the magnitude of the ripple. Therefore, a structure to detect the ripple is proposed which can be connected to electronic circuits to null the ripple or to compensate for the ripple.

Figure 15A:
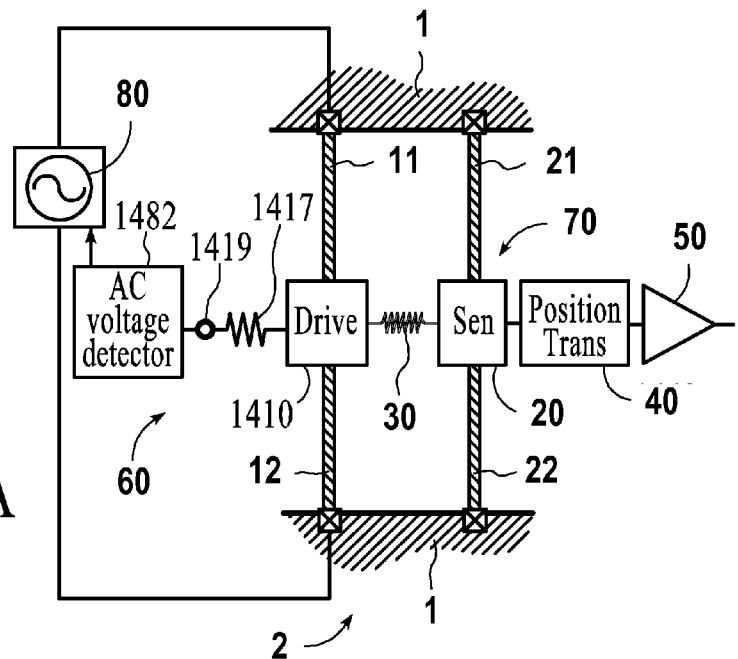
FIGS. 15A and 15B are embodiments of an AC voltage control system for a dual mode open-loop magnetometer system with (a) resistive type detection and (b) capacitive type detection.
Figure 15B:
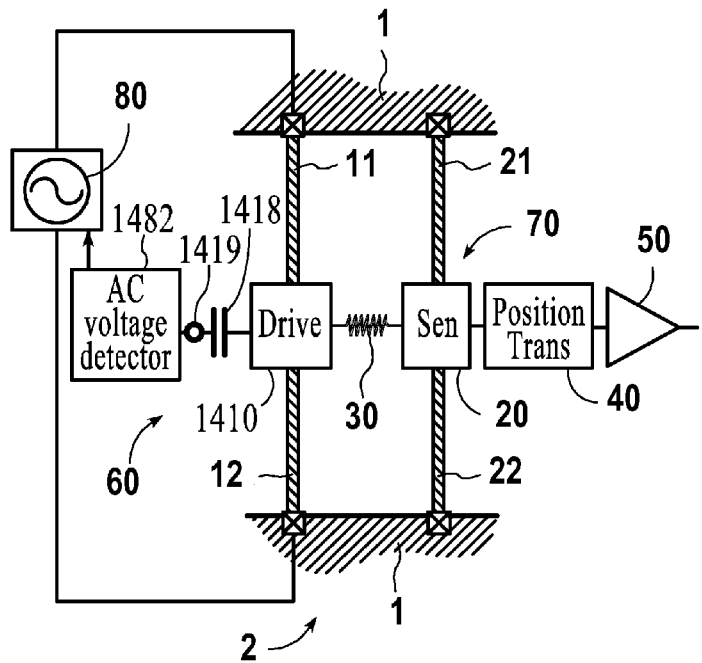

Shown in FIGS. 15A and 15B, the ripple detection at a drive point 1410 can be realized as the resistive type or capacitive type, respectively. Shown in FIG. 15A, a resistive type detection 1417 connects the drive point 1410 to an anchor 1419 wherein the ripple of the drive point 1410 causes a current flow through the plurality of beams resulting in the voltage variation at an anchor 1419. Thus, the ripple of the drive point 1410 can be measured at the anchor 1419 by the ripple detection mechanism. Shown in FIG. 15B, a capacitive type detection 1418 connects a drive point 1410 to an anchor 1419 wherein the ripple of the drive point 1410 causes a charge variation across the capacitor resulting in the current variation at the anchor 1419. Thus, the ripple of the drive point 1410 can be measured at the anchor 1419 by the ripple detection mechanism.

Figure 16A:
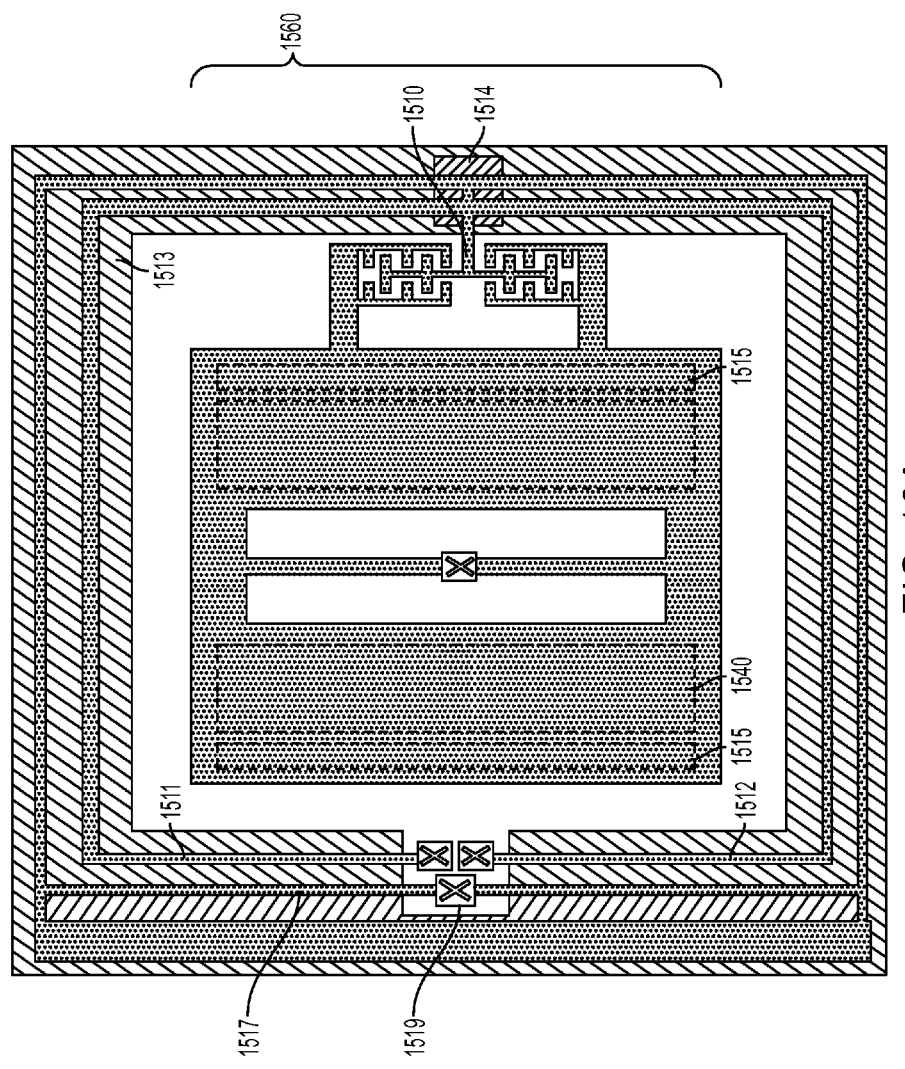
FIGS. 16A and 16B are embodiments of self-test actuators, force-balanced shield structures, and mismatch trim actuators with open-loop dual-mode Lorentz-force magnetic sensing devices for detecting (a) in-plane and (b) out-of-plane magnetic fields.
Figure 16B:
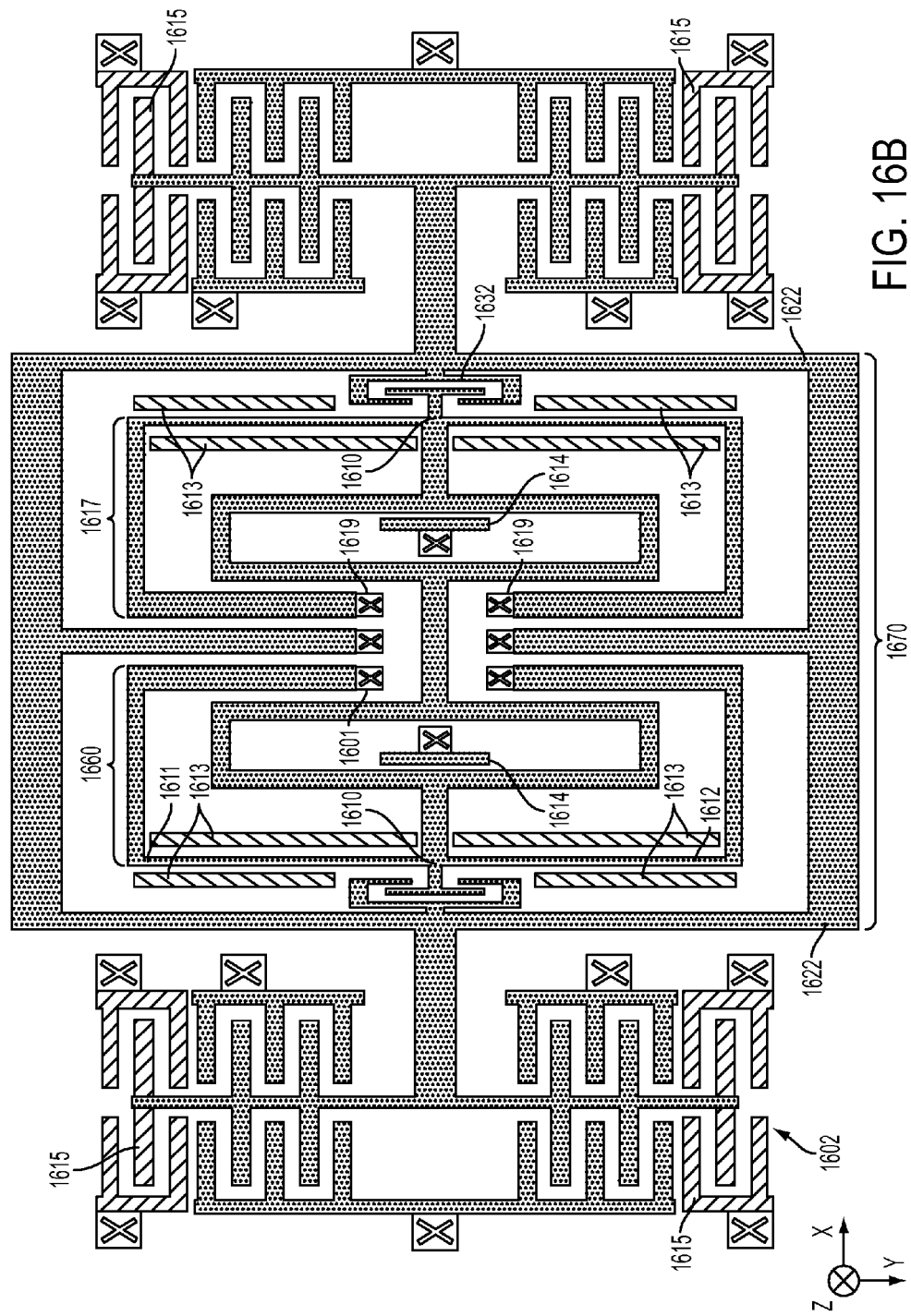

Examples of micromachined magnetic field sensors with the self test actuator, MTA, balanced shield, and resistive type ripple detection mechanism are shown in FIGS. 16A and 16B. FIG. 16A shows an x-axis micromachined magnetic field sensor 1502. An AC current generated by a drive electronic passes through a plurality of beams 1511 and 1512 and establishes a current vector in a Y-axis at a drive point 1510. A distributed Lorentz force is generated in a z-axis in the presence of a magnetic field in an x-axis. The sensor comprises an electrostatic actuator 1514 as a self test actuator to generate forces in the z-axis the same direction as the distributed Lorentz force, an electrostatic actuator 1515 as a MTA moving the sense subsystem along the z-axis, a balanced shield electrode 1513 located beneath a drive subsystem 1560 to null electrostatic offset torque about the y-axis, and a plurality of beams 1517 as a resistive type ripple detection mechanism and an anchor 1519 to sense the ripple voltage of the drive point 1510.

A Z-axis micromachined magnetic field sensor 1602 is shown in FIG. 16B. An AC current generated by a drive electronic passes through a plurality of beams 1611 and 1612 and establishes a current vector in a Y-axis at a drive point 1610. A distributed Lorentz force is generated in an X-axis of a drive subsystem 1660 in the presence of a magnetic field in a Z-axis. The sensor comprises an electrostatic actuator 1614 as a self test actuator to generate forces in the x-axis the same direction as the distributed Lorentz force, an electrostatic actuator 1615 as a MTA moving the sense subsystem along the x-axis, balanced shield electrodes 1613 close to the drive subsystem 1660 to null electrostatic offset forces in the x-axis, and a plurality of beams 1617 as a resistive type ripple detection mechanism and an anchor 1619 to detect the ripple voltage of the drive point 1610.

The examples of the offset cancellation techniques in a magnetic field sensing system noted here should not be interpreted to restrict the range of possible application of the offset cancellation techniques. It is advantageous to implement the offset cancellation techniques to other resonant applications comprising gyroscopes, accelerometers, chemical sensors, biosensors, pressure sensors, to force sensors.

Advantages

A magnetic field sensor is utilized for MEMS gyroscopes and accelerometers without major process change. In addition, the sensor addresses the need of low-power, high-manufacturability, and high-sensitivity. The sensor includes the following features.

1. A low cost and open-loop magnetic field resonant magnetic field sensor to achieve low power consumption in a system level circuit compared to a close loop frequency control resonant system.

2. Allows for use of a dual-mode resonating device to accommodate the process variation to achieve high manufacturability.

3. Incorporates an electrostatic coupling spring to deploy high bias voltage at the sensing node. The high bias voltage leads to high-sensitivity in the system.

4. Provides a low offset with several offset mitigation techniques to remove offset shift issues.

5. Includes a self-test function with electrostatic actuators to achieve low power consumption comparing to generating magnetic field directly with 3 mA supply.

Integration with other motion sensors. By harnessing these design strategies, a Lorentz force-effect resonant sensor can be implemented in a way to allow for on-chip integration of magnetic field sensors with other motion sensors.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A micromachined magnetic field sensor comprising:
a substrate;
a drive subsystem with a plurality of beams flexibly coupled to the substrate;
a mechanism for providing an electrical current through the drive subsystem along a first axis;
a magnetic field vector along a second axis generates a Lorentz force on the drive subsystem along a third axis;
a position transducer responds to the Lorentz force on the drive subsystem; and
an offset cancellation mechanism electrostatically coupled to the drive subsystem;
wherein the offset cancellation mechanism comprises at least one shield structure coupled to the substrate by at least one anchor, wherein the at least one shield structure comprises a plurality of beams spaced equally on opposite sides of the drive subsystem,
wherein the drive subsystem moves relative to the at least one shield structure.

2. The micromachined magnetic sensor of claim 1, wherein the offset cancellation mechanism comprises a mismatch-trimming actuator moving the sense subsystem along the second axis in order to reduce the gap mismatch of the force-balanced electrostatic coupling springs.

3. The micromachined magnetic sensor of claim 2, wherein the mismatch-trimming actuator comprises any of parallel plate capacitive transducers, Interdigitated comb capacitive transducers, electro-thermal actuators, and piezoelectric actuators.

4. The micromachined magnetic sensor of claim 1, wherein the offset cancellation mechanism comprises a resistive type ripple detection comprising a plurality of beams and at least one anchor where the resistive type detection connects the drive point to an anchor for detecting the ripple of the drive point.

5. The micromachined magnetic sensor of claim 1, wherein the offset cancellation mechanism comprises a capacitive type ripple detection comprising a capacitor supported by a plurality of beams and at least one anchor where the capacitor connects the drive point to an anchor for detecting the ripple of the drive point.

6. The micromachined magnetic field sensor of claim 1, wherein the at least one shield structure is biased with a DC voltage.

7. The micromachined magnetic field sensor of claim 6, wherein the DC voltage is adjusted for a minimum offset.

8. The micromachined magnetic field sensor of claim 1, wherein the position transducer responds to motion of the drive subsystem relative to the substrate.

9. The micromachined magnetic field sensor of claim 1, wherein the position transducer comprises a capacitive transducer, wherein the capacitive transducer is an interdigitated comb capacitive transducer or a parallel plate capacitive transducer.

10. A micromachined magnetic field sensor comprising:
a substrate;
a drive subsystem with a plurality of beams flexibly coupled to the substrate;
a mechanism for providing an electrical current through the drive subsystem along a first axis;
a magnetic field along a second axis generates a Lorentz force on the drive subsystem along a third axis;
a position transducer responds to the Lorentz force acting on the drive subsystem; and
an offset cancellation mechanism electrostatically coupled to the drive subsystem,
wherein the offset cancellation mechanism comprises force-balanced electrostatic coupling springs comprising two equal coupling capacitors wherein a first electrostatic force generated by a first capacitor is balanced by a second electrostatic force generated by a second capacitor.

11. The micromachined magnetic field sensor of claim 10, wherein the force-balancing electrostatic coupling springs connect to the drive subsystem at a point with zero AC voltage.

12. A micromachined magnetic field sensor comprising:
a substrate;
a drive subsystem with a plurality of beams flexibly coupled to the substrate;
a mechanism for providing an electrical current through at least one of the plurality of beams of the drive subsystem along a first axis;
a magnetic field along a second axis generates a Lorentz force on the drive subsystem along a third axis;
a position transducer responds to the Lorentz force acting on the drive subsystem; and
an offset cancellation mechanism electrostatically coupled to the at least one of the plurality of beams of the drive subsystem,
wherein the offset cancellation mechanism comprises at least one shield structure coupled to the substrate by at least one anchor, wherein the at least one shield structure is biased with a DC voltage to reduce electrostatic offset forces acting on the at least one beam.

13. The micromachined magnetic field sensor of claim 12, wherein the position transducer comprises a capacitive transducer, wherein the capacitive transducer is an interdigitated comb capacitive transducer or a parallel plate capacitive transducer.

* * * * *